(12) United States Patent
Yeom et al.

(10) Patent No.: US 11,476,327 B2
(45) Date of Patent: Oct. 18, 2022

(54) SEMICONDUCTOR DEVICES AND METHODS OF FABRICATING THE SAME

(71) Applicant: SAMSUNG ELECTRONICS CO., LTD., Suwon-si (KR)

(72) Inventors: Dong Hyuk Yeom, Seoul (KR); Kwan Heum Lee, Suwon-si (KR); Jun Kyum Kim, Pohang-si (KR); Seong Hwa Park, Seoul (KR); So Hyun Seo, Suwon-si (KR)

(73) Assignee: SAMSUNG ELECTRONICS CO., LTD.

( * ) Notice: Subject to any disclaimer, the term of this patent is extended or adjusted under 35 U.S.C. 154(b) by 32 days.

(21) Appl. No.: 17/176,667

(22) Filed: Feb. 16, 2021

(65) Prior Publication Data

US 2022/0020849 A1   Jan. 20, 2022

(30) Foreign Application Priority Data

Jul. 20, 2020 (KR) .......................... 10-2020-0089446

(51) Int. Cl.

| H01L 29/06 | (2006.01) |
|---|---|
| H01L 29/786 | (2006.01) |
| H01L 29/423 | (2006.01) |
| H01L 21/8238 | (2006.01) |
| H01L 29/10 | (2006.01) |
| H01L 29/08 | (2006.01) |
| H01L 27/092 | (2006.01) |

(52) U.S. Cl.
CPC .. *H01L 29/0653* (2013.01); *H01L 21/823814* (2013.01); *H01L 21/823864* (2013.01); *H01L 27/092* (2013.01); *H01L 29/0847* (2013.01); *H01L 29/1033* (2013.01); *H01L 29/42392* (2013.01); *H01L 29/78696* (2013.01)

(58) Field of Classification Search
CPC ............... H01L 29/785; H01L 29/0653; H01L 29/78696; H01L 29/6656; H01L 29/66553
See application file for complete search history.

(56) References Cited

U.S. PATENT DOCUMENTS

| 9,892,926 | B2 | 2/2018 | Cai et al. |
|---|---|---|---|
| 10,243,060 | B2 | 3/2019 | Chao et al. |
| 10,297,508 | B2 | 5/2019 | Cheng et al. |
| 10,522,616 | B2 | 12/2019 | Cho et al. |
| 10,566,445 | B2 | 2/2020 | Bl et al. |
| 2019/0267463 | A1 | 8/2019 | Chao et al. |
| 2019/0341450 | A1 | 11/2019 | Lee et al. |
| 2020/0027959 | A1 | 1/2020 | Cheng et al. |
| 2021/0336063 | A1* | 10/2021 | Liao .................... H01L 29/0673 |

* cited by examiner

*Primary Examiner* — Changhyun Yi
(74) *Attorney, Agent, or Firm* — Myers Bigel, P.A.

(57) ABSTRACT

A semiconductor device includes a gate electrode extending in a first direction, on a substrate, first outer spacers extending along side surfaces of the gate electrode, a first active pattern extending in a second direction, which intersects the first direction, to penetrate the gate electrode and the first outer spacers, epitaxial patterns on the first active pattern and on side surfaces of the first outer spacers, second outer spacers between the first outer spacers and the epitaxial patterns and inner spacers between the substrate and the first active pattern and between the gate electrode and the epitaxial patterns, wherein in a cross section that intersects the second direction, at least parts of the second outer spacers are on side surfaces of the first active pattern and side surfaces of the inner spacers.

20 Claims, 31 Drawing Sheets

SEMICONDUCTOR DEVICES AND METHODS OF FABRICATING THE SAME

CROSS-REFERENCE TO RELATED APPLICATION

This application claims priority to Korean Patent Application No. 10-2020-0089446, filed on Jul. 20, 2020, and all the benefits accruing therefrom under 35 U.S.C. § 119, the disclosure of which is incorporated herein by reference in its entirety.

BACKGROUND

1. Field

The present disclosure relates to semiconductor devices and methods of fabricating the same, and particularly, to semiconductor devices including a multi-bridge channel and methods of fabricating the semiconductor devices.

2. Description of the Related Art

As a scaling technique for increasing the density of integrated circuit devices, a multi-gate transistor has been suggested in which a fin- or nanowire-shaped silicon body is formed on a substrate and a gate is formed on the surface of the silicon body.

The multi-gate transistor may be scaled up or down because it uses a three-dimensional (3D) channel. Also, an improved current control capability may be provided without the need to increase the gate length of the multi-gate transistor. Also, a short channel effect (SCE) in which the electric potential of a channel region is affected by a drain voltage can be effectively reduced and/or suppressed.

SUMMARY

Embodiments of the present disclosure provide semiconductor devices with improved yield and operating characteristics.

Embodiments of the present disclosure also provide methods of fabricating a semiconductor device with improved yield and operating characteristics.

However, embodiments of the present disclosure are not restricted to those set forth herein. The above and other embodiments of the present disclosure will become more apparent to one of ordinary skill in the art to which the present disclosure pertains by referencing the detailed description of the present disclosure given below.

According to an embodiment of the present disclosure, there is provided a semiconductor device comprising, a gate electrode extending in a first direction, on a substrate, first outer spacers extending along side surfaces of the gate electrode, a first active pattern extending in a second direction, which intersects the first direction, to penetrate the gate electrode and the first outer spacers, epitaxial patterns on the first active pattern and on side surfaces of the first outer spacers, second outer spacers between the first outer spacers and the epitaxial patterns and inner spacers between the substrate and the first active pattern and between the gate electrode and the epitaxial patterns, wherein in a cross section that intersects the second direction, at least parts of the second outer spacers are on side surfaces of the first active pattern and side surfaces of the inner spacers.

According to the aforementioned and other embodiments of the present disclosure, there is provided a semiconductor device comprising, a gate electrode extending in a first direction, on a substrate, first outer spacers extending along side surfaces of the gate electrode, an active pattern extending in a second direction, which intersects the first direction, to penetrate the gate electrode and the first outer spacers, epitaxial patterns on the active pattern and on side surfaces of the first outer spacers, the epitaxial patterns protruding away from the substrate beyond a top surface of the active pattern, second outer spacers between the first outer spacers and the epitaxial patterns and on the top surface of the active pattern, and third outer spacers extending along side surfaces of the first outer spacers, top surfaces of the second outer spacers, and top surfaces of the epitaxial patterns wherein a dielectric constant of the second outer spacers is greater than a dielectric constant of the first outer spacers and a dielectric constant of the third outer spacers.

According to the aforementioned and other embodiments of the present disclosure, there is provided a semiconductor device comprising a substrate including an n-type metal-oxide semiconductor (NMOS) region and a p-type metal-oxide semiconductor (PMOS) region, a first gate electrode extending in a first direction, on the NMOS region, a first active pattern extending in a second direction, which intersects the first direction, to penetrate the first gate electrode, first epitaxial patterns on the first active pattern and on side surfaces of the first gate electrode, a second gate electrode extending in a third direction, on the PMOS region, a second active pattern extending in a fourth direction, which intersects the third direction, to penetrate the second gate electrode, first outer spacers extending along side surfaces of the first gate electrode and side surfaces of the second gate electrode, second outer spacers between the first outer spacers and the first epitaxial patterns and third outer spacers extending along side surfaces of the first outer spacers, top surfaces of the second outer spacers, top surfaces of the first epitaxial patterns, and top surfaces of the second epitaxial patterns, wherein a dielectric constant of the second outer spacers is greater than a dielectric constant of the first outer spacers and a dielectric constant of the third outer spacers.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings.

DETAILED DESCRIPTION

Semiconductor devices according to some embodiments of the present disclosure will hereinafter be described with reference to FIGS. 1 to 13.

Although the terms "first," "second," etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure. As used herein, the term "and/or" includes any and all combinations of one or more of the associated listed items. Expressions such as "at least one of," when preceding a list of elements, modify the entire list of elements and do not modify the individual elements of the list.

Figure 1:
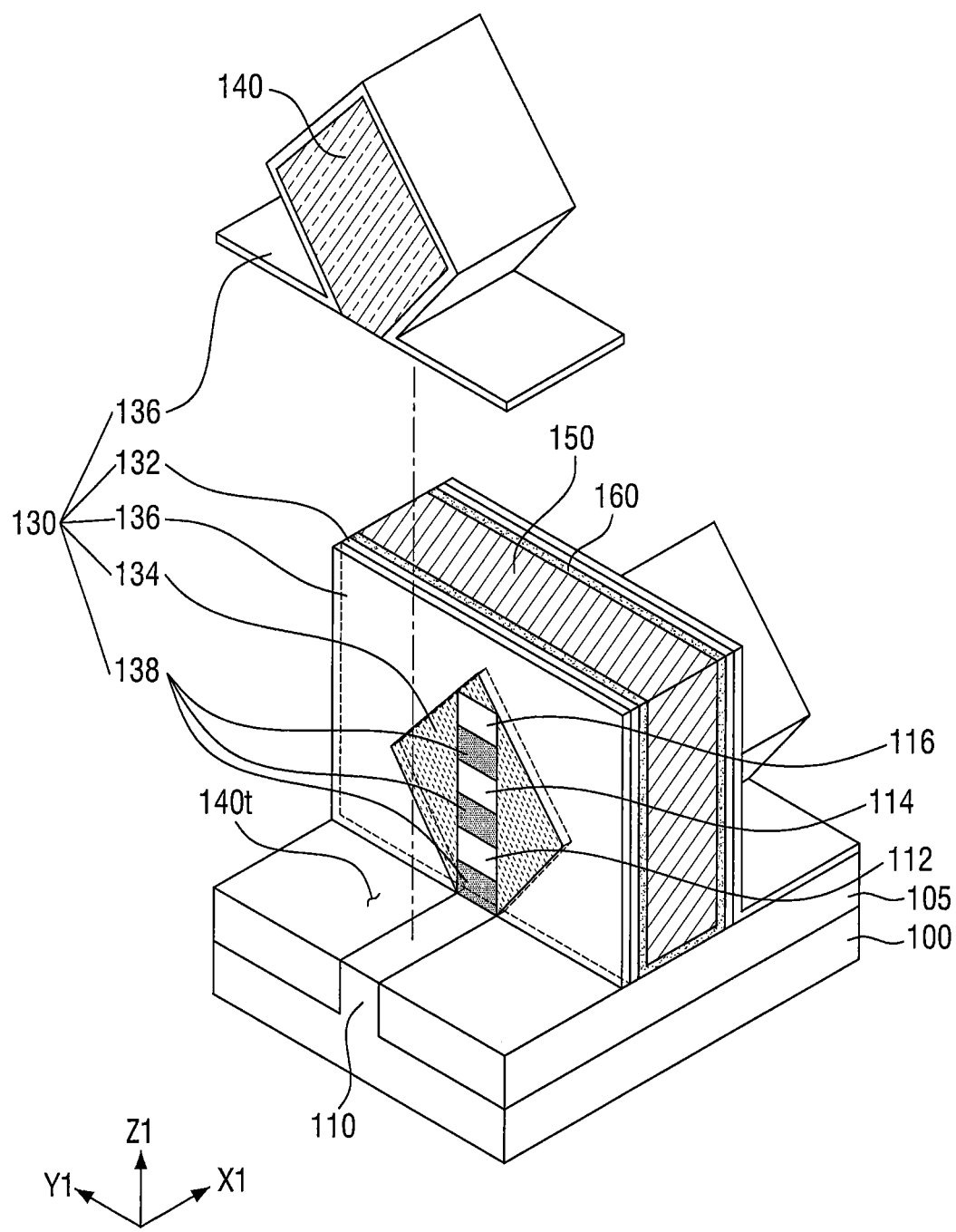
FIG. 1 is a partial exploded perspective view of a semiconductor device according to some embodiments of the present disclosure.
Figure 2:
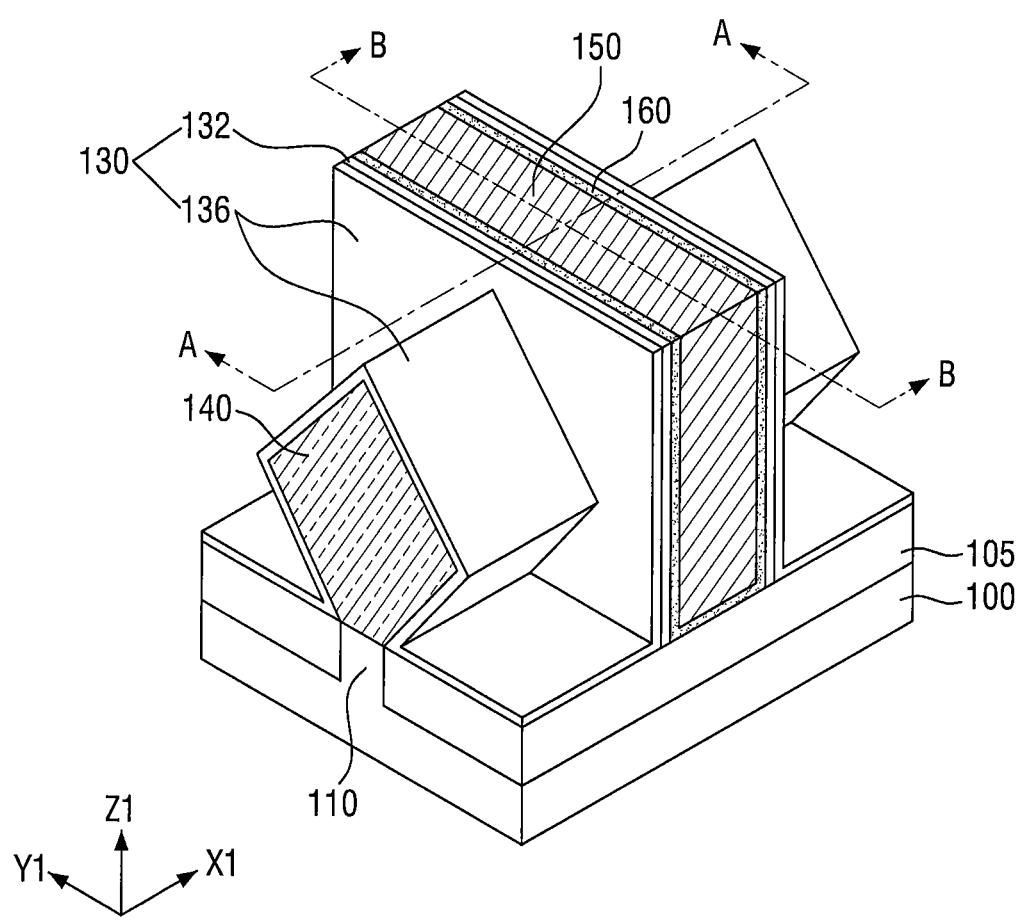
FIG. 2 is a perspective view of the semiconductor device of FIG. 1.
Figure 3:
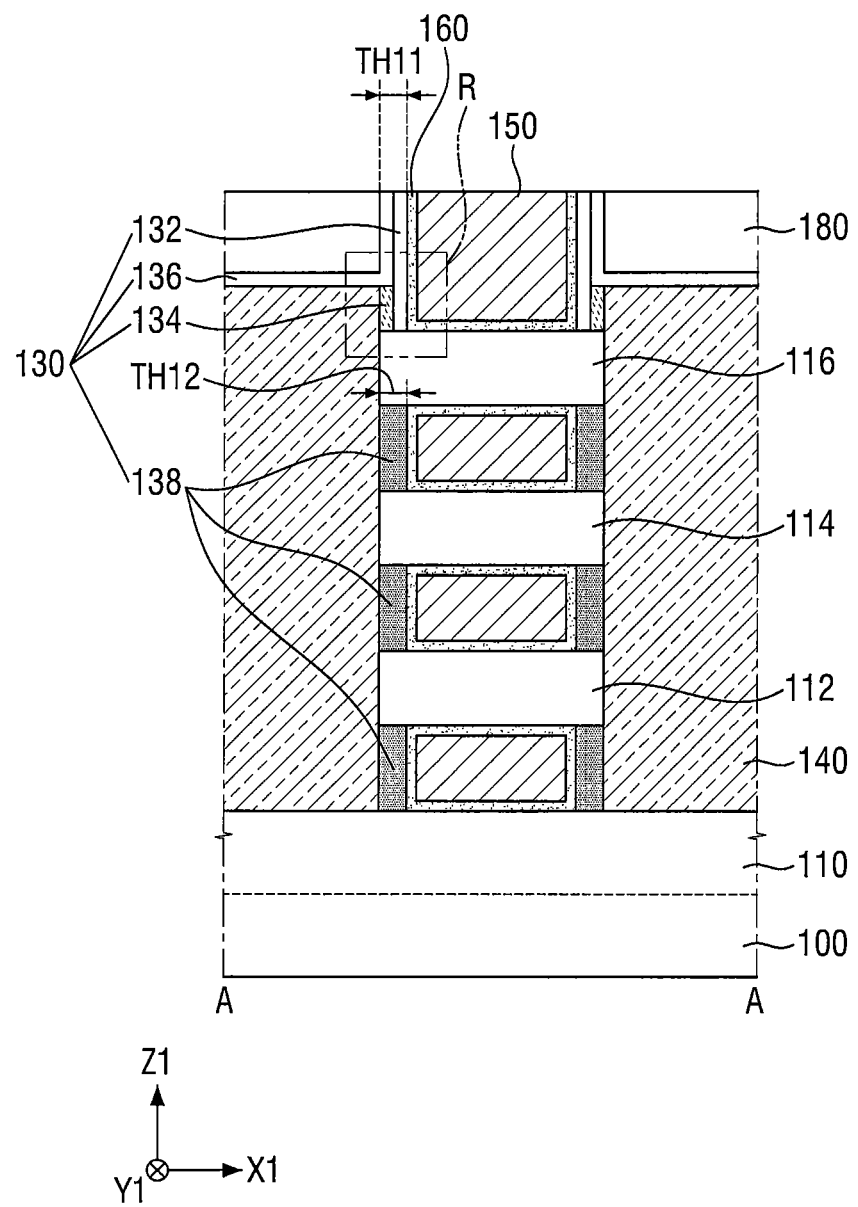
FIG. 3 is a cross-sectional view taken along line A-A of FIG. 2.
Figure 4A:
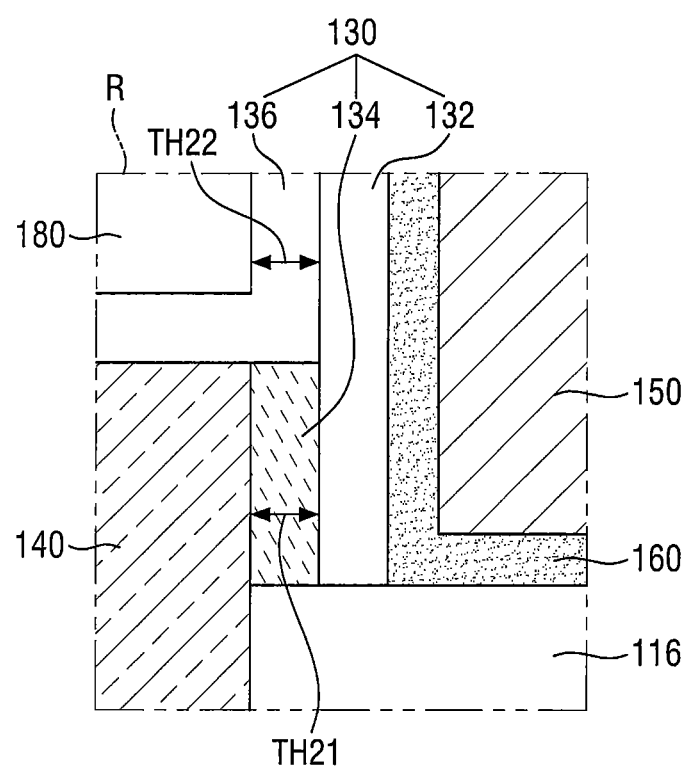
FIGS. 4A to 4C are enlarged cross-sectional views illustrating an area R of FIG. 3.
Figure 4B:
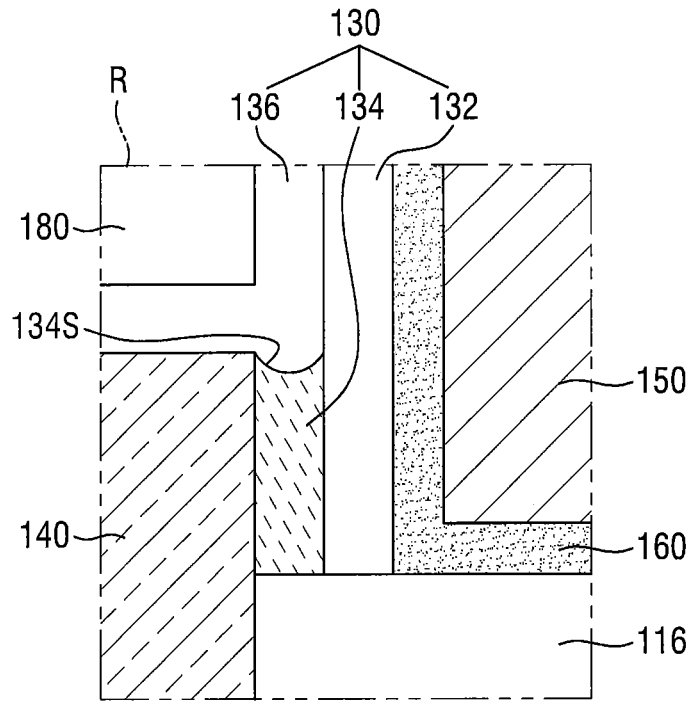
Figure 4C:
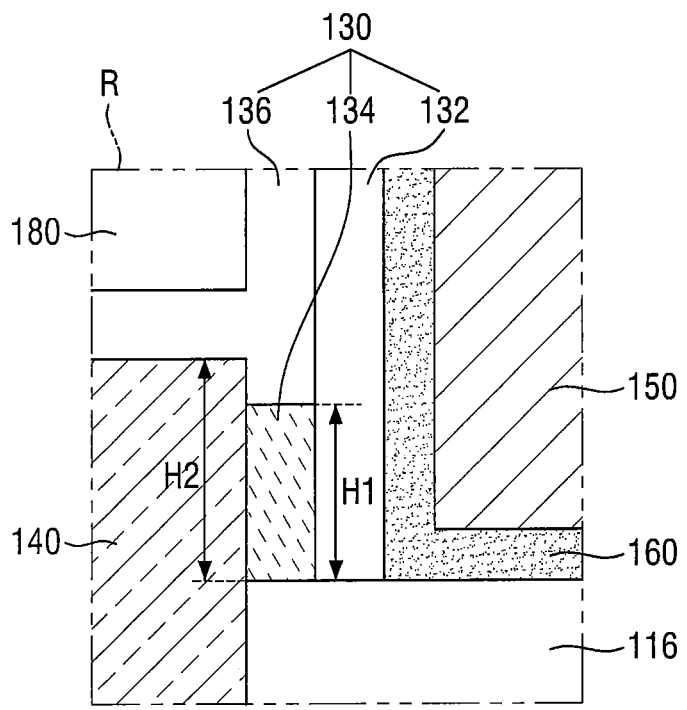
Figure 5:
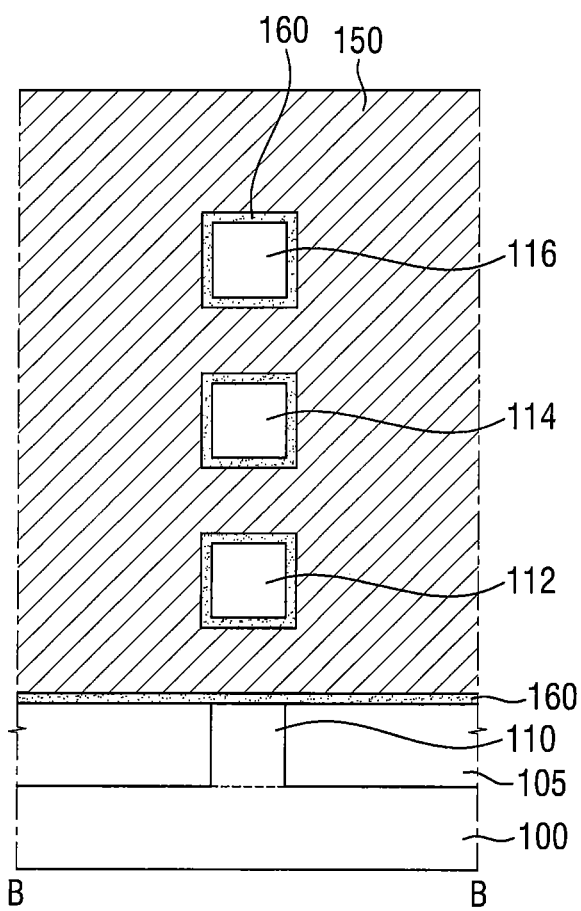
FIG. 5 is a cross-sectional view taken along line B-B of FIG. 2.

FIG. 1 is a partial exploded perspective view of a semiconductor device according to some embodiments of the present disclosure. FIG. 2 is a perspective view of the semiconductor device of FIG. 1. FIG. 3 is a cross-sectional view taken along line A-A of FIG. 2. FIGS. 4A to 4C are enlarged cross-sectional views illustrating an area R of FIG. 3. FIG. 5 is a cross-sectional view taken along line B-B of FIG. 2. For convenience, an interlayer insulating film 180 is not illustrated in FIG. 1.

Referring to FIGS. 1 to 5, the semiconductor device according to some embodiments of the present disclosure includes a substrate 100, a first field insulating film 105, a first active pattern 112, a second active pattern 114, a third active pattern 116, a first gate electrode 150, a first gate dielectric film 160, gate spacers 130, first epitaxial patterns 140, and the interlayer insulating film 180.

The substrate 100 may be a bulk silicon substrate or a silicon-on-insulator (SOI) substrate. In some embodiments, the substrate 100 may be a silicon substrate or may include, for example, silicon germanium, silicon germanium-on-insulator (SGOI), indium antimonide, lead tellurium compounds, indium arsenic, indium phosphide, gallium arsenic, or gallium antimonide. In some embodiments, the substrate 100 may be an epitaxial layer formed on a base substrate. For convenience, the substrate 100 will hereinafter be described as being a silicon substrate.

In some embodiments, the substrate 100 may include a first fin-type protrusion 110. The first fin-type protrusion 110 may protrude from the top surface of the substrate 100 and may extend in a first direction X1 parallel to the top surface of the substrate 100. The first fin-type protrusion 110 may be obtained by etching part of the substrate 100 or may be an epitaxial layer grown from the substrate 100.

The first field insulating film 105 may be formed on the substrate 100. The first field insulating film 105 may surround at least parts of side surfaces of the first fin-type protrusion 110. For example, the first fin-type protrusion 110 may be defined by the first field insulating film 105. FIG. 2 illustrates that the side surfaces of the first fin-type protrusion 110 are generally surrounded by the first field insulating film 105, but the present disclosure is not limited thereto.

The first field insulating film 105 may include at least one of, for example, an oxide film, a nitride film, an oxynitride film, and a combination thereof, but the present disclosure is not limited thereto.

The first, second, and third active patterns 112, 114, and 116 may intersect the first gate electrode 150. For example, the first, second, and third active patterns 112, 114, and 116 may extend in the first direction X1, and the first gate electrode 150 may extend in a second direction Y1, which intersects the first direction X1.

The first, second, and third active patterns 112, 114, and 116 may be sequentially disposed on the substrate 100. For example, the first, second, and third active patterns 112, 114, and 116 may be sequentially arranged in a third direction Z1, which intersects the top surface of the substrate 100. The first, second, and third active patterns 112, 114, and 116 may overlap one another in the third direction Z1.

The first, second, and third active patterns 112, 114, and 116 may be spaced apart from one another. Also, the first, second, and third active patterns 112, 114, and 116 may be spaced apart from the substrate 100 and/or the first fin-type protrusion 110. For example, the first active pattern 112 may be spaced apart from the first fin-type protrusion 110, over the first fin-type protrusion 110, the second active pattern 114 may be spaced apart from the first active pattern 112, over the first active pattern 112, and the third active pattern 116 may be spaced apart from the second active pattern 114, over the second active pattern 114. In some embodiments, the first active pattern 112 may be the lowermost active pattern among the first, second, and third active patterns (112, 114, and 116) that penetrate the first gate electrode 150. In some embodiments, the third active pattern 116 may be the uppermost active pattern among the first, second, and third active patterns (112, 114, and 116) that penetrate the first gate electrode 150.

The first, second, and third active patterns 112, 114, and 116 may include an element semiconductor material such as silicon (Si) or germanium (Ge). In some embodiments, the first, second, and third active patterns 112, 114, and 116 may include a compound semiconductor such as, for example, a group IV-IV compound semiconductor or a group III-V compound semiconductor.

The group IV-IV compound semiconductor may be, for example, a binary or ternary compound containing at least two of carbon (C), Si, Ge, and tin (Sn) or a compound obtained by doping the binary or ternary compound with a group IV element.

The group III-V compound semiconductor may be, for example, a binary, ternary, or quaternary compound obtained by combining at least one group III element such as aluminum (Al), gallium (Ga), or indium (In) and at least one group V element such as phosphorus (P), arsenic (As), or antimony (Sb).

The first, second, and third active patterns 112, 114, and 116 may be used as the channel region of a transistor including the first gate electrode 150. The semiconductor device according to some embodiments of the present disclosure is illustrated as including only three active patterns, but the present disclosure is not limited thereto. In some embodiments, the semiconductor device according to some embodiments of the present disclosure may include two or less active patterns or four or more active patterns.

The first gate electrode 150 may be formed on the substrate 100 and the first field insulating film 105. The first gate electrode 150 may intersect the first, second, and third active patterns 112, 114, and 116. For example, the first gate electrode 150 may be parallel to the top surface of the substrate 100 and may extend in the second direction Y1, which intersects the first direction X1.

The first, second, and third active patterns 112, 114, and 116 may extend in the first direction X1 and may penetrate the first gate electrode 150. Accordingly, the first gate electrode 150 may be formed to surround the first, second, and third active patterns 112, 114, and 116. The first gate electrode 150 may be formed in the space between the substrate 100 and the first active pattern 112.

The first gate electrode 150 may include a conductive material. For example, the first gate electrode 150 may include at least one of TiN, WN, TaN, ruthenium (Ru), TiC, TaC, titanium (Ti), silver (Ag), Al, TiAl, TiAlN, TiAlC, TaCN, TaSiN, manganese (Mn), zirconium (Zr), tungsten (W), and a combination thereof, but the present disclosure is not limited thereto. The first gate electrode 150 may be formed by, for example, a replacement process, but the present disclosure is not limited thereto.

The first gate electrode 150 is illustrated as being a single film, but the present disclosure is not limited thereto. In some embodiments, the first gate electrode 150 may be formed by depositing a plurality of conductive materials. For example, the first gate electrode 150 may include a work function control film that controls a work function and a filling conductive film that fills a space formed by the work function control film. The work function control film may include at least one of, for example, TiN, TaN, TiC, TaC, TiAlC, and a combination thereof. The filling conductive film may include, for example, W or Al.

The first gate dielectric film 160 may be interposed between the first active pattern 112 and the first gate electrode 150, between the second active pattern 114 and the first gate electrode 150, and between the third active pattern 116 and the first gate electrode 150. For example, the first gate dielectric film 160 may be formed to be on and/or surround the first, second, and third active patterns 112, 114, and 116. The first gate dielectric film 160 may extend along the top surfaces of the first field insulating film 105 and the first fin-type protrusion 110.

The first gate dielectric film 160 may include at least one of, for example, silicon oxide, silicon oxynitride, silicon nitride, and a high-k material having a greater dielectric constant than silicon oxide. The high-k material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but the present disclosure is not limited thereto.

Although not specifically illustrated, an interface film may be formed between the first active pattern 112 and the first gate dielectric film 160, between the second active pattern 114 and the first gate dielectric film 160, and/or between the third active pattern 116 and the first gate dielectric film 160. The interface film may be formed to be on and/or surround the first, second, and third active patterns 112, 114, and 116, but the present disclosure is not limited thereto.

The first epitaxial patterns 140 may be formed on the substrate 100. Also, the first epitaxial patterns 140 may be formed on side surfaces of the first gate electrode 150. For example, as illustrated in FIG. 1, first source/drain trenches 140t, which are defined by the top surface of the first fin-type protrusion 110, may be formed on the side surfaces of the first gate electrode 150. The first epitaxial patterns 140 may be formed in the first source/drain trenches 140t.

The first epitaxial patterns 140 may be spaced apart from the first gate electrode 150 by the gate spacers 130. The first epitaxial patterns 140 may be connected to the first, second, and third active patterns 112, 114, and 116. For example, the first, second, and third active patterns 112, 114, and 116 may be connected to the first epitaxial patterns 140 through (e.g., penetrating through) the gate spacers 130. The first epitaxial patterns 140 may be used as source/drain regions of the transistor including the first gate electrode 150.

Each of the first epitaxial patterns 140 may include an epitaxial layer formed on the substrate 100. For example, the first epitaxial patterns 140 may be formed by an epitaxial growth method. The first epitaxial patterns 140 are illustrated as being single films, but the present disclosure is not limited thereto. In some embodiments, each of the first epitaxial patterns 140 may be formed by depositing a plurality of epitaxial layers. For example, each of the first epitaxial patterns 140 may include a plurality of epitaxial layers sequentially stacked on the first fin-type protrusion 110 and having different impurity concentrations.

In some embodiments, cross sections of the first epitaxial patterns 140 that intersect the first direction X1 may have a diamond (or a pentagonal or hexagonal shape), but the present disclosure is not limited thereto. That is, cross sections of the first epitaxial patterns 140 that intersect the first direction X1 may have various other shapes in a cross-sectional view.

In some embodiments, the first epitaxial patterns 140 may protrude beyond the top surface of the uppermost active pattern (e.g., the third active pattern 116) among the first, second, and third active patterns (112, 114, and 116) that penetrate the first gate electrode 150. For example, the first epitaxial patterns 140 may be elevated source/drain regions whose top surfaces protrude beyond (e.g., are farther from the substrate 100 than) the top surface of the third active pattern 116.

In a case where the semiconductor device according to some embodiments of the present disclosure is an n-type metal-oxide semiconductor (NMOS) transistor, the first epitaxial patterns 140 may include n-type impurities or impurities for preventing the diffusion of n-type impurities. For example, the first epitaxial patterns 140 may include at least one of P, Sb, As, and a combination thereof.

In a case where the semiconductor device according to some embodiments of the present disclosure is an NMOS transistor, the first epitaxial patterns 140 may include a tensile stress material. For example, in a case where the first, second, and third active patterns 112, 114, and 116 include Si, the first epitaxial patterns 140 may include a material having a smaller lattice constant than Si such as, for example, SiC. The tensile stress material can apply tensile stress to the first, second, and third active patterns 112, 114, and 116 and can thus improve the mobility of carriers in a channel region.

In a case where the semiconductor device according to some embodiments of the present disclosure is a p-type metal-oxide semiconductor (PMOS) transistor, the first epitaxial patterns 140 may include p-type impurities or impurities for preventing the diffusion of p-type impurities. For example, the first epitaxial patterns 140 may include at least one of boron (B), C, In, Ga, Al, and a combination thereof.

In a case where the semiconductor device according to some embodiments of the present disclosure is a PMOS transistor, the first epitaxial patterns 140 may include a compressive stress material. For example, in a case where the first, second, and third active patterns 112, 114, and 116 include Si, the first epitaxial patterns 140 may include a material having a greater lattice constant than Si. For example, the first epitaxial patterns 140 may include SiGe. The compressive stress material can apply compressive stress to the first and second active patterns 112 and 114 and can thus improve the mobility of carriers in a channel region.

The gate spacers 130 may be formed on the substrate 100 and the first field insulating film 105. The gate spacers 130 may extend along the side surfaces of the first gate electrode 150. The gate spacers 130 may electrically insulate the first gate electrode 150 and the first epitaxial patterns 140.

The first, second, and third active patterns 112, 114, and 116 may extend in the first direction X1 to penetrate the gate spacers 130. The gate spacers 130 may be disposed at and/or adjacent the ends of each of the first, second, and third active patterns 112, 114, and 116. The gate spacers 130 may be formed to be on and/or surround the ends of each of the first, second, and third active patterns 112, 114, and 115.

In some embodiments, the first gate dielectric film 160 may further extend along inner side surfaces (e.g., side surfaces closest to the first gate electrode 150) of the gate spacers 130. For example, the first gate dielectric film 160 may extend conformally between the first gate electrode 150 and the first active pattern 112, between the first gate electrode 150 and the second active pattern 114, between the first gate electrode 150 and the third active pattern 116, and between the first gate electrode 150 and the gate spacers 130.

Each of the gate spacers 130 may include an inner spacer 138, a first outer spacer 132, a second outer spacer 134, and a third outer spacer 136, which are stacked on a side surface of the first gate electrode 150.

Inner spacers 138 may be formed on the side surfaces of the first gate electrode 150. The inner spacers 138 may be interposed between the first gate electrode 150 and the first epitaxial patterns 140. In some embodiments, the inner spacers 138 may be formed on outer side surfaces of the first gate dielectric film 160 (e.g., side surfaces on an opposite side of the first gate dielectric film 160 from the first gate electrode 150). In some embodiments, the inner spacers 138 may be in contact with the first gate dielectric film 160 and the first epitaxial patterns 140.

The inner spacers 138 may be interposed between the first, second, and third active patterns (112, 114, and 116) that penetrate the first gate electrode 150. For example, the inner spacers 138 may be interposed between the first and second active patterns 112 and 114 and between the second and third active patterns 114 and 116. The inner spacers 138 may be interposed between the substrate 100 and the first active pattern 112.

First outer spacers 132 may be formed on the side surfaces of the first gate electrode 150. For example, the first outer spacers 132 may extend conformally along the side surfaces of the first gate electrode 150. In some embodiments, the first outer spacers 132 may extend along the outer side surfaces of the first gate dielectric film 160. In some embodiments, the first outer spacers 132 may be in contact with the outer side surfaces of the first gate dielectric film 160.

In a cross section that intersects the first direction X1, the first outer spacers 132 may surround the first, second, and third active patterns 112, 114, and 116 and the inner spacers 138. For example, in a cross section that intersects the first direction X1, the first, second, and third active patterns 112, 114, and 116 and the inner spacers 138 may be formed in the first outer spacers 132.

Second outer spacers 134 may be formed on outer side surfaces of the first outer spacers 132. The second outer spacers 134 may be interposed between the first outer spacers 132 and the first epitaxial patterns 140. In some embodiments, the second outer spacers 134 may be in contact with the first epitaxial patterns 140.

For example, as illustrated in FIGS. 3 and 4A, the tops of the first epitaxial patterns 140 may protrude beyond the top surface of the third active pattern 116. In this example, at least part of the second outer spacers 134 may be interposed between the first outer spacers 132 and the first epitaxial patterns 140, on the top surface of the third active pattern 116.

Also, as illustrated in FIGS. 1 and 2, in a cross section that intersects the first direction X1, side surfaces of each of the first epitaxial patterns 140 may protrude beyond side surfaces of the first active pattern 112, side surfaces of the second active pattern 114, side surfaces of the third active pattern 116, and side surfaces of the inner spacers 138. At least parts of the second outer spacers 134 may be interposed between the first outer spacers 132 and the first epitaxial patterns 140, on the side surfaces of the first active pattern 112, the side surfaces of the second active pattern 114, the side surfaces of the third active pattern 116, and the side surfaces of the inner spacers 138. That is, in a cross section that intersects the first direction X1, at least part of the second outer spacers 134 may cover the side surfaces of the first active pattern 112, the side surfaces of the second active pattern 114, the side surfaces of the third active pattern 116, and the side surfaces of the inner spacers 138.

FIG. 1 illustrates that the second outer spacers 134 completely cover the first, second, and third active patterns 112, 114, and 116 and the inner spacers 138, but the present disclosure is not limited thereto. In some embodiments, in a cross section that intersects the first direction X1, at least parts of the first, second, and third active patterns 112, 114, and 116 and at least parts of the inner spacers 138 may be exposed by the second outer spacers 134. For example, parts of the side surfaces of the inner spacers 138, parts of the side surfaces of the third active pattern 116, and part of the top surface of the third active pattern 116 may be exposed by the second outer spacers 134.

In some embodiments, the circumference and/or perimeter of cross sections of the second outer spacers 134 may be similar to the circumference and/or perimeter of cross sections of the first epitaxial patterns 140. For example, as illustrated in FIG. 1, the circumference and/or perimeter of cross sections of the second outer spacers 134 that intersect the first direction X1 has the same shape as the circumference and/or perimeter of cross sections of the first epitaxial patterns 140 that intersect the first direction X1. For example, the circumference and/or perimeter of cross sections of the second outer spacers 134 that intersect the first direction X1 may form a diamond shape (or a pentagonal or hexagonal shape).

In some embodiments, the size of the second outer spacers 134 may be the same as, or smaller than, the size of the first epitaxial patterns 140. For example, the size of cross sections of the second outer spacers 134 that intersect the first direction X1 may be the same as, or smaller than, the size of cross sections of the first epitaxial patterns 140 that intersect the first direction X1. For example, as illustrated in FIG. 3, the height of the top surfaces of the second outer spacers 134 may be the same as, or smaller than, the height of the top surfaces of the first epitaxial patterns 140.

In some embodiments, a thickness TH21 (of FIG. 4A) of the second outer spacers 134 may be smaller than a thickness TH12 (of FIG. 3) of the inner spacers 138.

Third outer spacers 136 may be formed on the outer side surfaces of the first outer spacers 132. For example, the second outer spacers 134 may cover parts of the outer side surfaces of the first outer spacers 132 (e.g., side surfaces on an opposite side of the first outer spacers 132 from the first gate electrode 150), and the third outer spacers 136 may be on and/or cover other parts of the outer side surfaces of the first outer spacers 132.

Also, the third outer spacers 136 may be on and/or cover the first outer spacers 132, the second outer spacers 134, the first epitaxial patterns 140, and the first field insulating film 105. For example, the third outer spacers 136 may extend conformally along the outer side surfaces of the first outer spacers 132, the circumferences and/or perimeters of the second outer spacers 134, the circumferences and/or perimeters of the first epitaxial patterns 140, and the top surface of the first field insulating film 105. For example, as illustrated in FIG. 3, the third outer spacers 136 may extend conformally along the outer side surfaces of the first outer spacers 132, the top surfaces of the second outer spacers 134, and the top surfaces of the first epitaxial patterns 140. As illustrated in FIG. 4A, the top surfaces of the second outer spacers 134 may be substantially coplanar with the top surfaces of the first epitaxial patterns 140.

In some embodiments, a thickness (e.g., TH22 of FIG. 4A) of the third outer spacers 136 may be smaller than the thickness (e.g., TH12 of FIG. 3) of the inner spacers 138. FIG. 4A illustrates that the thickness TH22 of the third outer spacers 136 is the same as the thickness TH21 of the second outer spacers 134, but the present disclosure is not limited thereto. In some embodiments, the thickness TH22 of the third outer spacers 136 may be greater than, or smaller than, the thickness TH21 of the second outer spacers 134.

FIG. 3 illustrates that the sum of the thicknesses of the first and second outer spacers 132 and 134 (TH11, or the sum of the thicknesses of the first and third outer spacers 132 and 136) is the same as the thickness TH12 of the inner spacers 138, but the present disclosure is not limited thereto. In some embodiments, the sum of the thicknesses of the first and second outer spacers 132 and 134 (TH11, or the sum of the thicknesses of the first and third outer spacers 132 and 136) may be greater than, or smaller than, the thickness TH12 of the inner spacers 138.

In some embodiments, the dielectric constant of the second outer spacers 134 may be greater than the dielectric constant of the first outer spacers 132, the dielectric constant of the third outer spacers 136, and the dielectric constant of the inner spacers 138. For example, the second outer spacers 134 may have a dielectric constant of about 6 or greater, and the first outer spacers 132, the third outer spacers 136, and the inner spacers 138 may have a dielectric constant of about 5 or less.

In some embodiments, the second outer spacers 134 may include silicon nitride (e.g., $Si_3N_4$). The first outer spacers 132, the third outer spacers 136, and the inner spacers 138 may include an insulating material having a smaller dielectric constant than silicon nitride. For example, the first outer spacers 132, the third outer spacers 136, and the inner spacers 138 may include at least one of silicon oxynitride (SiON), silicon carbonitride (SiCN), silicon carbide (SiC), silicon oxycarbide (SiOC), silicon boron nitride (SiBN), silicon boron carbonitride (SiBCN), and silicon oxycarbonitride (SiOCN). The first outer spacers 132, the third outer spacers 136, and the inner spacers 138 may include the same material or different materials.

The interlayer insulating film 180 may be formed on the substrate 100 and the first field insulating film 105. The interlayer insulating film 180 may be formed to be within and/or fill spaces on the side surfaces of the first gate electrode 150. For example, the interlayer insulating film 180 may be formed to be on and/or cover the third outer spacers 136.

The interlayer insulating film 180 may include at least one of, for example, silicon oxide, silicon nitride, silicon oxynitride, and a low-k dielectric material. The low-k dielectric material may include at least one of, for example, flowable oxide (FOX), tonen silazene (TOSZ), undoped silicate glass (USG), borosilicate glass (BSG), phosphosilicate glass (PSG), borophosphosilicate glass (BPSG), plasma-enhanced tetra-ethyl-ortho-silicate (PETEOS), fluoride silicate glass (FSG), carbon-doped silicon oxide (CDO), Xerogel, Aerogel, amorphous fluorinated carbon, organo silicate glass (OSG), parylene, bis-benzocyclobutene (BCB), SiLK, polyimide, a porous polymeric material, and a combination thereof, but the present disclosure is not limited thereto.

Referring to FIGS. 1 to 3 and 4B, surfaces of the second outer spacers 134 that face the third outer spacers 136 may be concave.

For example, as illustrated in FIG. 4B, top surfaces 134S of the second outer spacers 134 that face the third outer spacers 136 may be concave. The third outer spacers 136 may extend along the top surfaces of the second outer spacers 134. Accordingly, surfaces of the third outer spacers 136 that face the second outer spacers 134 may be convex.

Referring to FIGS. 1 to 3 and 4C, the size of the second outer spacers 134 may be smaller m than the size of the first epitaxial patterns 140.

For example, as illustrated in FIG. 4C, a height H1 from the top surface of the third active pattern 116 to the uppermost parts of the second outer spacers 134 may be smaller than a height 142 from the top surface of the third active pattern 116 to the uppermost parts of the first epitaxial patterns 140.

Figure 6:
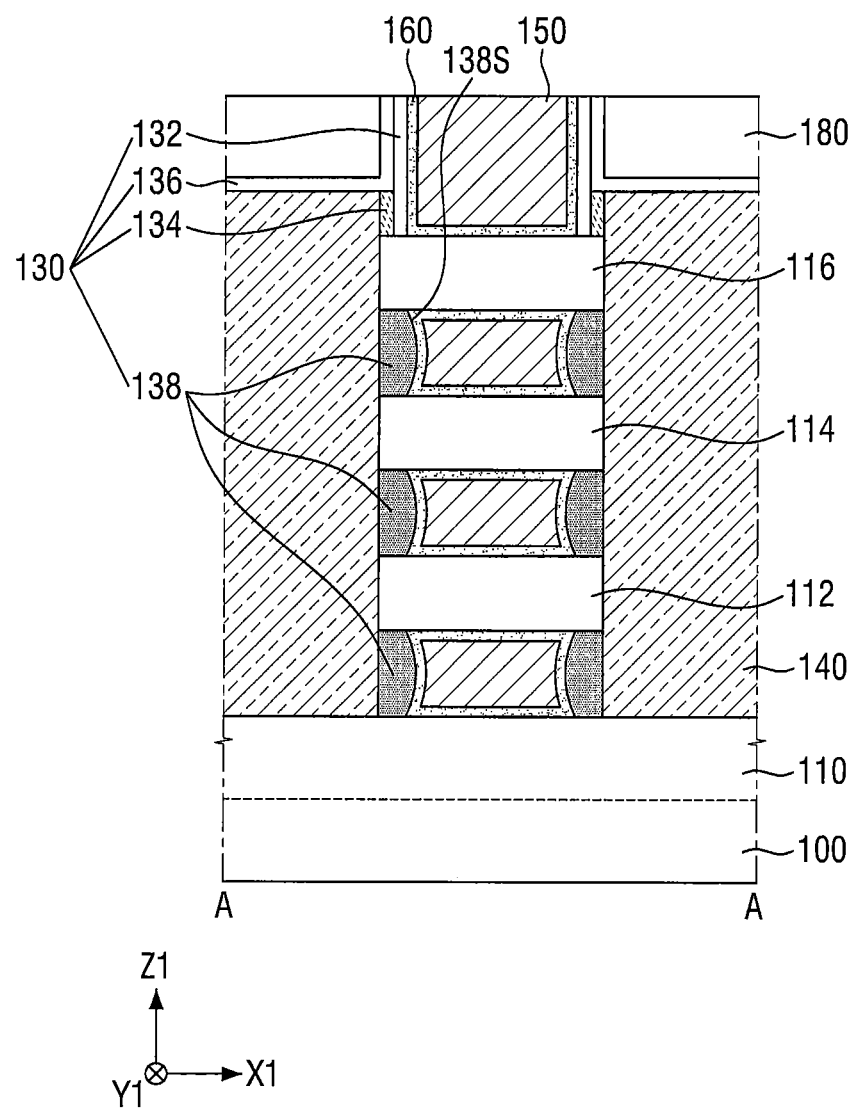
FIGS. 6 and 7 are cross-sectional views of semiconductor devices according to some embodiments of the present disclosure.
Figure 7:
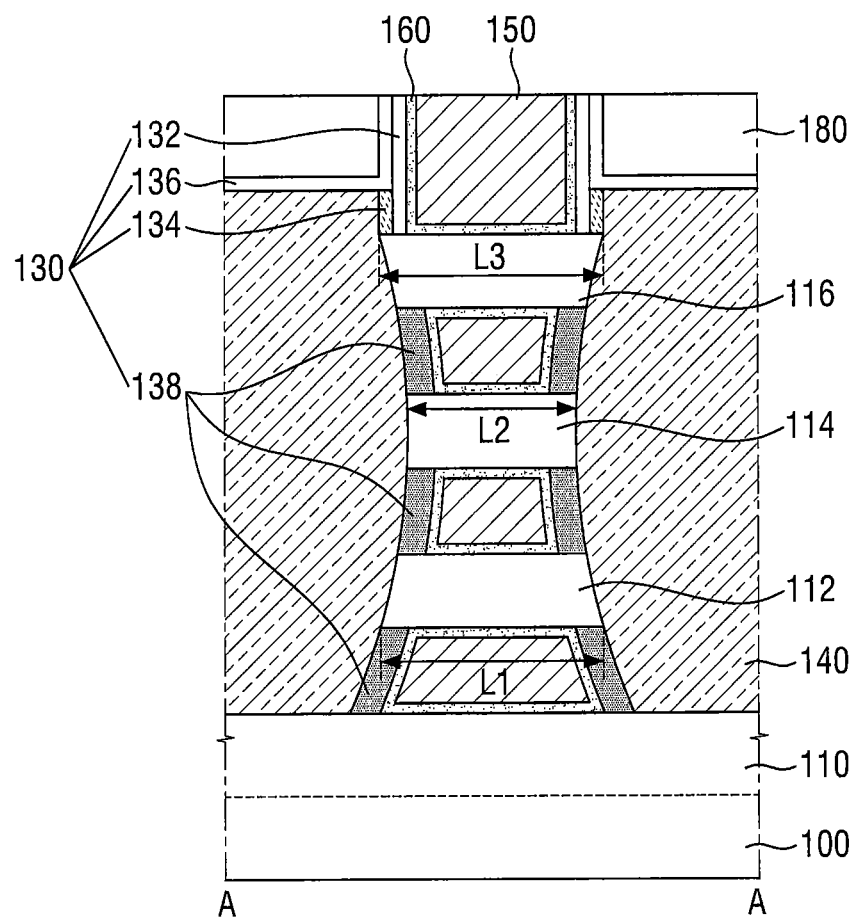

FIGS. 6 and 7 are cross-sectional views of semiconductor devices according to some embodiments of the present disclosure. For convenience, descriptions of elements or features that have already been described above with reference to FIGS. 1 to 5 will be omitted or simplified.

Referring to FIG. 6, surfaces of an inner spacer 138 that face a first gate electrode 150 are convex.

For example, inner side surfaces 138S of the inner spacers 138 that face the first gate electrode 150 may be convex. In some embodiments, a first gate dielectric film 160 may extend conformally along the inner side surfaces 138S of the inner spacers 138. Side surfaces of the first gate electrode 150 that face the inner spacers 138 may be concave.

Referring to FIG. 7, the length of the first, second, and third active patterns (112, 114, and 116) that penetrate a first gate electrode 150 may decrease and then increase away from a substrate 100.

Here, the length of the first, second, and third active patterns (112, 114, and 116) denotes the length, in the first direction X1, of the first, second, and third active patterns (112, 114, and 116). For example, a length L1 of a first active pattern 112 may be greater than a length L2 of the second active pattern 114, and the length L2 of the second active pattern 114 may be smaller than a length L3 of the third active pattern 116.

In some embodiments, the length L1 of the first active pattern 112 may gradually decrease away from the top surface of the substrate 100. In some embodiments, the length L2 of the second active pattern 114 may decrease and then increase away from the top surface of the substrate 100. In some embodiments, the length L3 of the third active pattern 116 may gradually increase away from the top surface of the substrate 100.

Figure 8:
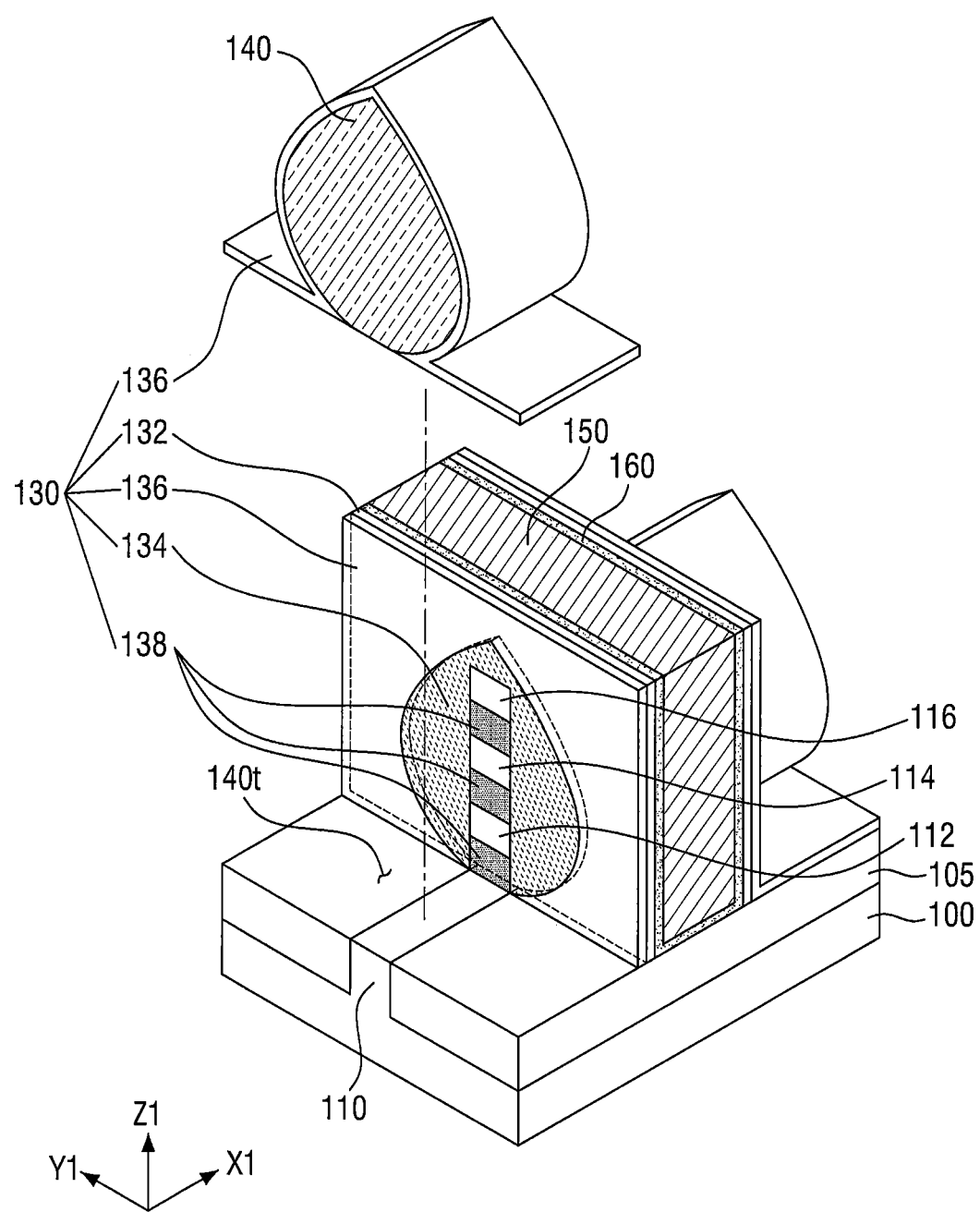
FIG. 8 is a partial exploded perspective view of a semiconductor device according to some embodiments of the present disclosure.

FIG. 8 is a partial exploded perspective view of a semiconductor device according to some embodiments of the present disclosure. For convenience, descriptions of elements or features that have already been described above with reference to FIGS. 1 to 7 will be omitted or simplified.

Referring to FIG. 8, at least parts of cross sections of first epitaxial patterns 140 that intersect a first direction X1 may have a rounded shape.

For example, cross sections of the first epitaxial patterns 140 that intersect the first direction X1 may have a spade, teardrop, or heart shape.

In some embodiments, the circumferences and/or perimeters of cross sections of second outer spacers 134 may be similar to the circumferences and/or perimeters of cross sections of the first epitaxial patterns 140. For example, the circumference and/or perimeter of cross sections of the second outer spacers 134 that intersect the first direction X1 may have the same shape as the circumferences and/or perimeters of cross sections of the first epitaxial patterns 140 that intersect the first direction X1. Accordingly, at least parts of the cross sections of the second outer spacers 134 that intersect the first direction X1 may have a rounded shape. For example, the circumferences and/or perimeters of the cross sections of the second outer spacers 134 that intersect the first direction X1 may form a spade, teardrop, or heart shape.

Figure 9:
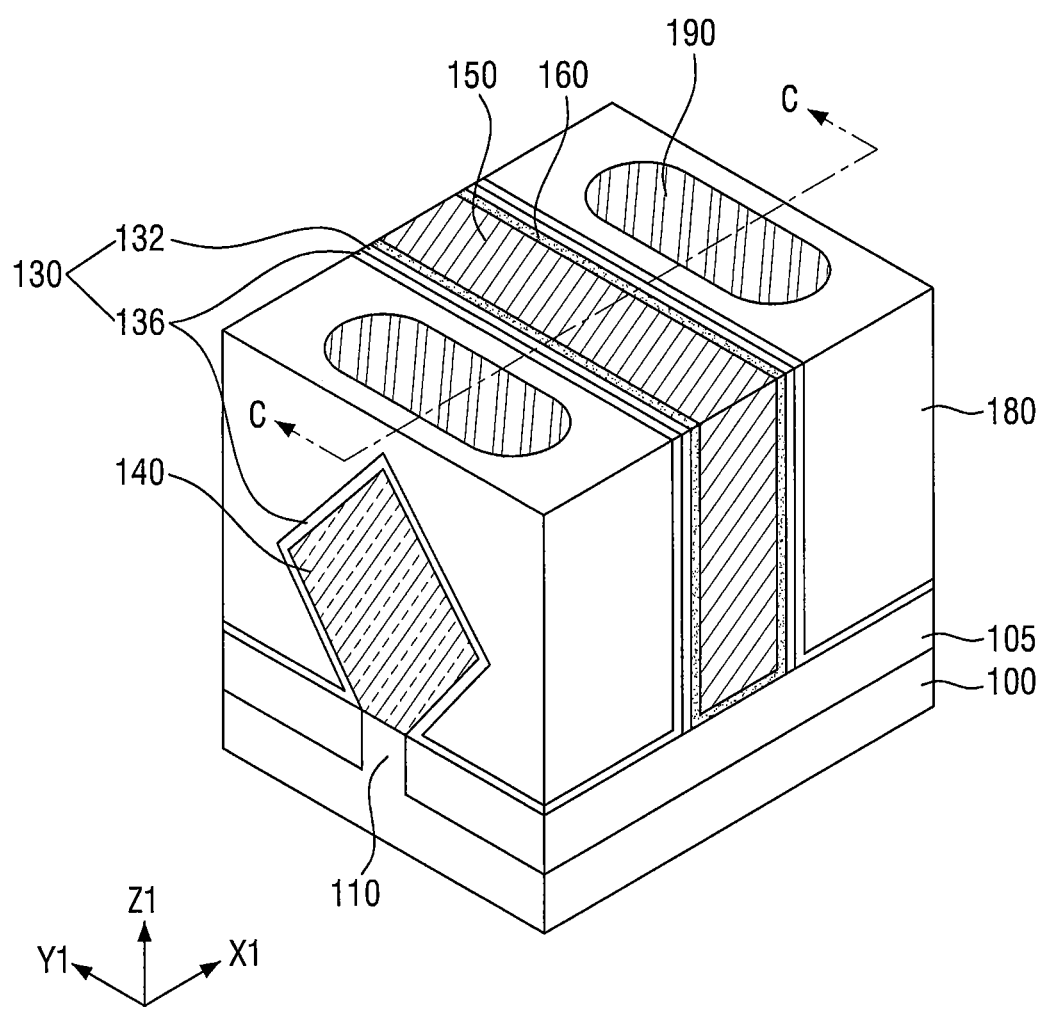
FIG. 9 is a perspective view of a semiconductor device according to some embodiments of the present disclosure.
Figure 10:
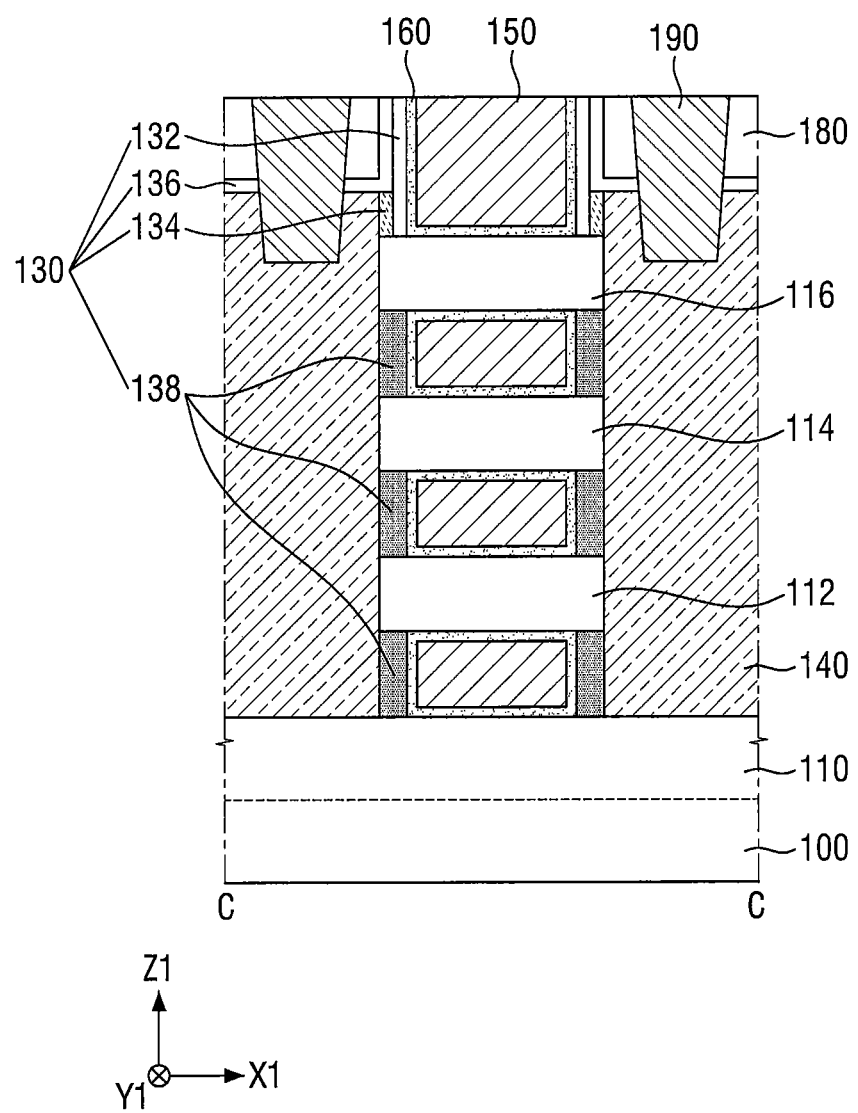
FIG. 10 is a cross-sectional taken along line C-C of FIG. 9.

FIG. 9 is a perspective view of a semiconductor device according to some embodiments of the present disclosure. FIG. 10 is a cross-sectional taken along line C-C of FIG. 9. For convenience, descriptions of elements or features that have already been described above with reference to FIGS. 1 to 8 will be omitted or simplified.

Referring to FIGS. 9 and 10, the semiconductor device of FIGS. 9 and 10 further includes source/drain contacts 190.

The source/drain contacts 190 may be formed to be electrically connected to first epitaxial patterns 140. For example, the source/drain contacts 190 may be connected to the first epitaxial patterns 140 through (e.g., penetrating through) an interlayer insulating film 180, second outer spacers 134, and/or third outer spacers 136. The source/drain contacts 190 may include, for example, W, Al, or copper (Cu), but the present disclosure is not limited thereto.

The source/drain contacts 190 are illustrated as being single films, but the present disclosure is not limited thereto. In some embodiments, each of the source/drain contacts 190 may be formed by depositing a plurality of conductive materials. For example, the source/drain contacts 190 may include silicide films that are in contact with the first epitaxial patterns 140 and penetrating conductive films that are formed on the silicide films to penetrate the second outer spacers 134, the third outer spacers 136, and/or the interlayer insulating film 180. The silicide film may include, for example, platinum (Pt), nickel (Ni), or cobalt (Co). The penetrating conductive film may include, for example, titanium (Ti), titanium nitride (TiN), W, Al, or Cu.

Figure 11:
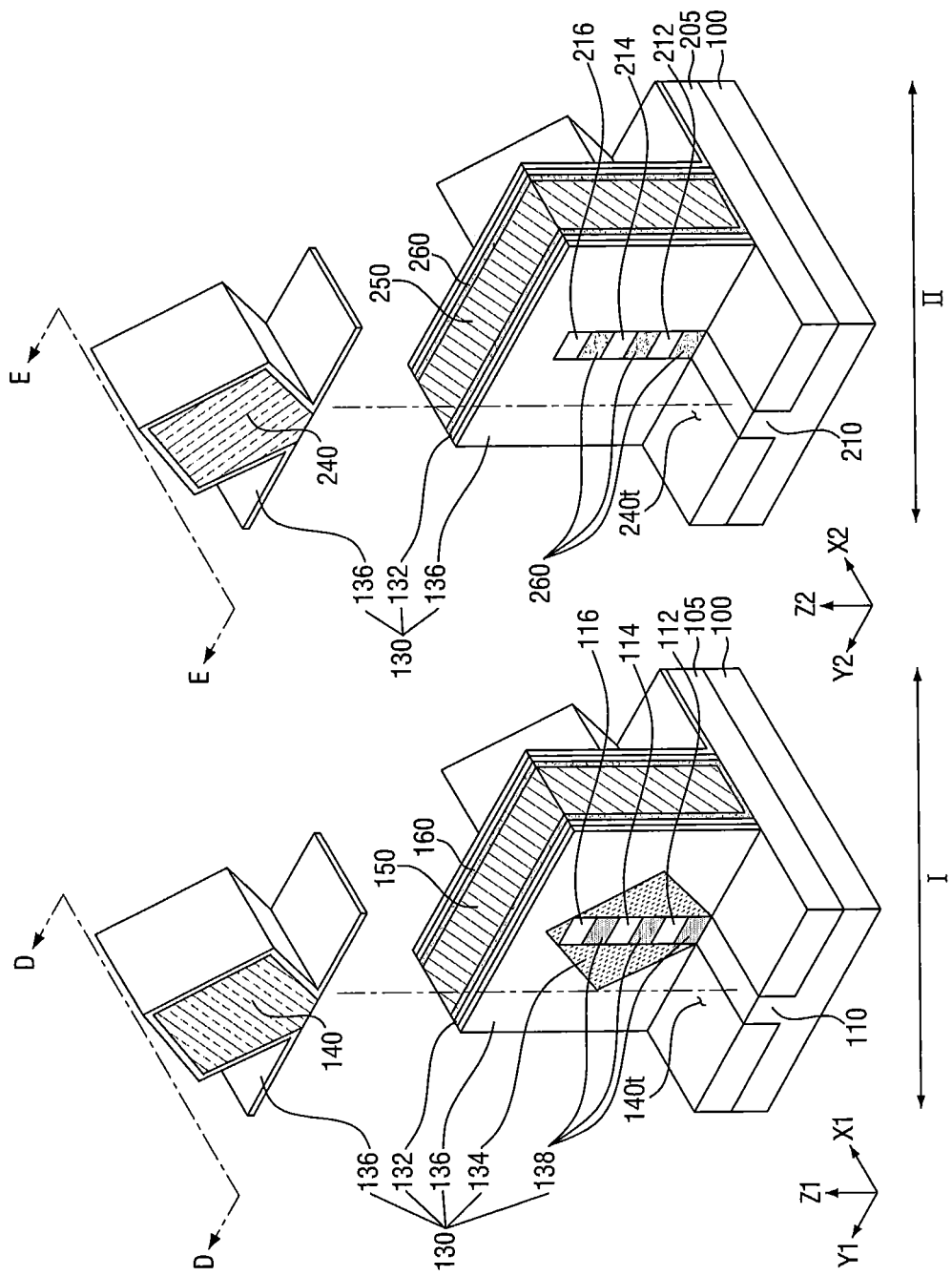
FIG. 11 is a partial exploded perspective view of a semiconductor device according to some embodiments of the present disclosure.
Figure 12:
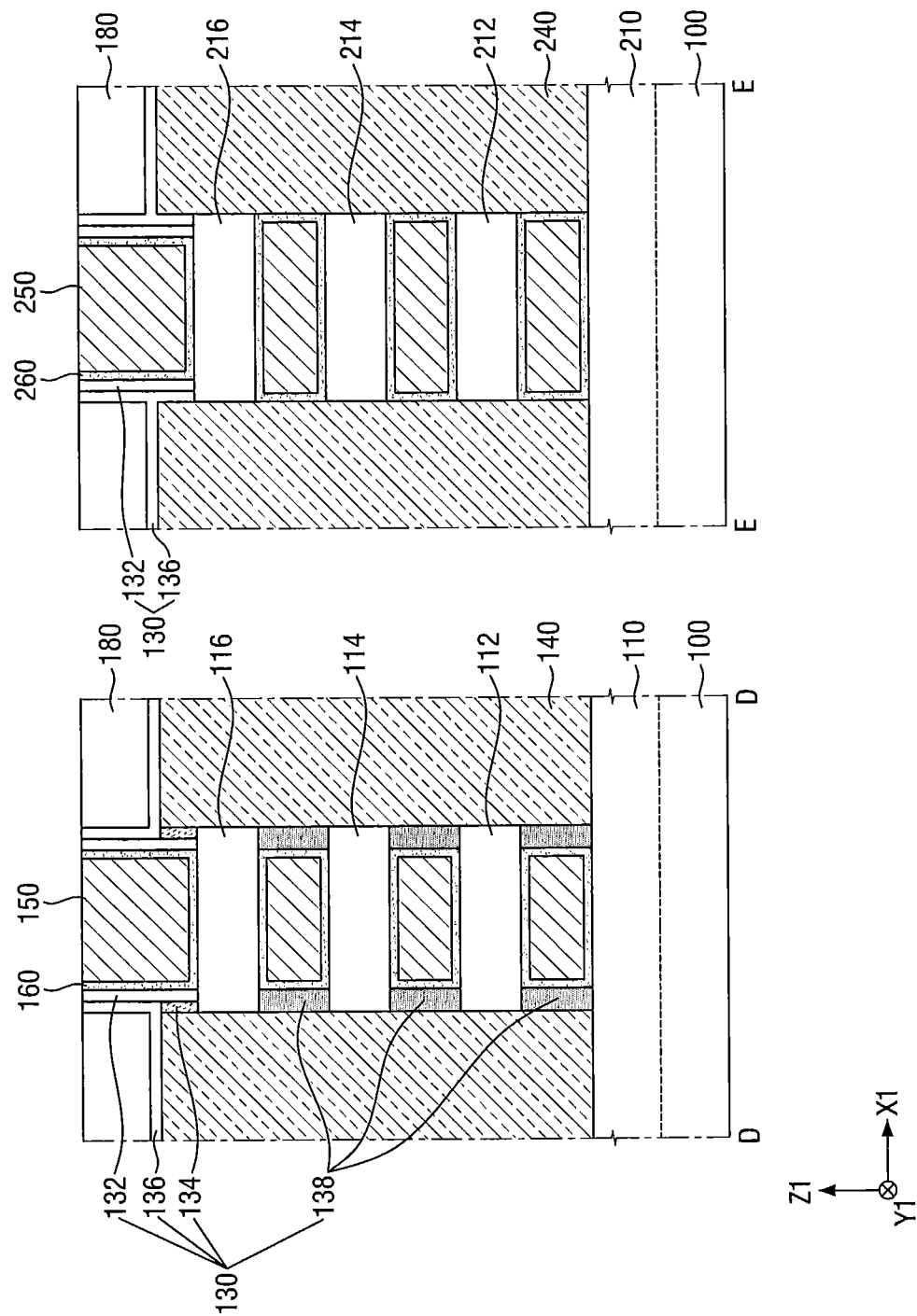
FIGS. 12 and 13 are cross-sectional views taken along lines D-D and E-E of FIG. 11.
Figure 13:
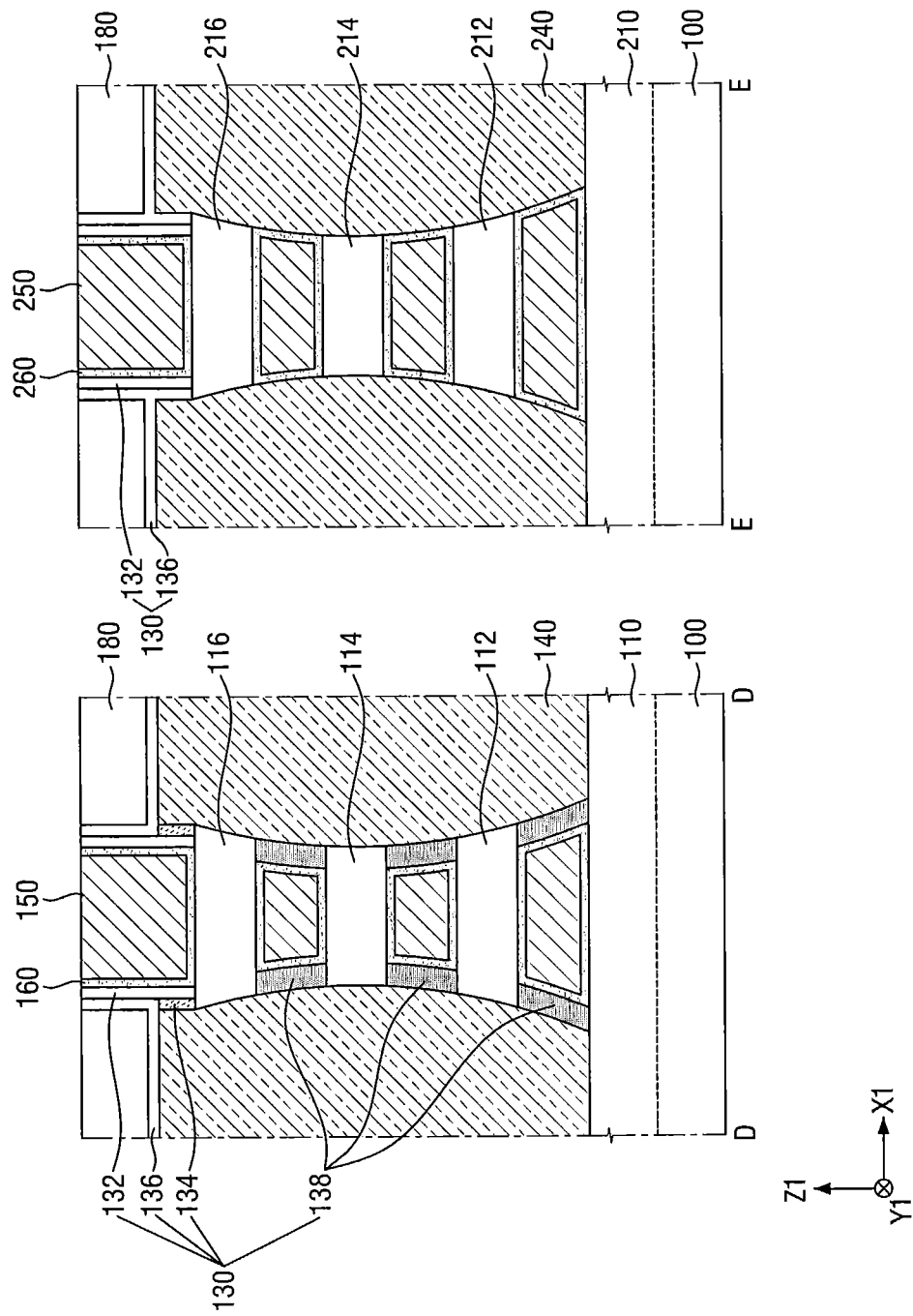

FIG. 11 is a partial exploded perspective view of a semiconductor device according to some embodiments of the present disclosure. FIGS. 12 and 13 are cross-sectional views taken along lines D-D and E-E of FIG. 11. For convenience, descriptions of elements or features that have already been described above with reference to FIGS. 1 to 10 will be omitted or simplified. Also, for convenience, an interlayer insulating film 180 is not illustrated in FIG. 11.

Referring to FIGS. 11 and 12, a substrate 100 may include first and second regions I and II.

The first and second regions I and II may be connected to each other or spaced apart from each other. Transistors of the same conductivity type or transistors of different conductivity types may be formed in the first and second regions I and II. The first and second regions I and II may be, for example, logic regions, static random access memory (SRAM) regions, or input/output (I/O) regions. That is, the first and second regions I and II may be regions that perform the same function or different functions.

The semiconductor device formed on the first region I of the substrate 100 is substantially the same as the semiconductor device of FIGS. 1 to 5, and thus, a detailed description thereof will be omitted.

In some embodiments, a second field insulating film 205, a fourth active pattern 212, a fifth active pattern 214, a sixth active pattern 216, a second gate electrode 250, a second gate dielectric film 260, and second epitaxial patterns 240 may be formed on the second region II of the substrate 100.

In some embodiments, the second region II of the substrate 100 may include a second fin-type protrusion 210. The second fin-type protrusion 210 may protrude from the top surface of the substrate 100 and may extend in a fourth direction X2, which is parallel to the top surface of the substrate 100.

The second field insulating film 205 may be formed on the second region II of the substrate 100. The second field insulating film 205 may surround at least parts of side surfaces of the second fin-type protrusion 210. The second field insulating film 205 may include at least one of, for example, an oxide film, a nitride film, an oxynitride film, and a combination thereof, but the present disclosure is not limited thereto.

The fourth, fifth, and sixth active patterns 212, 214, and 216 may intersect the second gate electrode 250 that will be described later. For example, the fourth, fifth, and sixth active patterns 212, 214, and 216 may extend in the fourth direction X2, and the second gate electrode 250 may extend in a fifth direction Y2, which intersects the fourth direction X2. The fourth direction X2 is illustrated as being the same as the first direction X1, but the present disclosure is not limited thereto. In some embodiments, the fourth direction X2 may be different from the first direction X1.

The fourth, fifth, and sixth active patterns 212, 214, and 216 may be sequentially disposed on the second region II of the substrate 100. For example, the fourth, fifth, and sixth active patterns 212, 214, and 216 may be sequentially arranged in a sixth direction Z2, which intersects the top surface of the substrate 100. The fourth, fifth, and sixth active patterns 212, 214, and 216 may be spaced apart from one another. Also, the fourth, fifth, and sixth active patterns 212, 214, and 216 may be spaced apart from the substrate 100 and/or the second fin-type protrusion 210.

The fourth, fifth, and sixth active patterns 212, 214, and 216 may include an element semiconductor material such as Si or Ge. In some embodiments, the fourth, fifth, and sixth active patterns 212, 214, and 216 may include a compound semiconductor such as, for example, a group IV-IV compound semiconductor or a group III-V compound semiconductor.

The fourth, fifth, and sixth active patterns 212, 214, and 216 may be used as the channel region of a transistor including the second gate electrode 250.

The second gate electrode 250 may be formed on the second region II of the substrate 100 and the second field insulating film 205. The second gate electrode 250 may intersect the fourth, fifth, and sixth active patterns 212, 214, and 216.

The fourth, fifth, and sixth active patterns 212, 214, and 216 may extend in the fourth direction X2 and may penetrate the second gate electrode 250. Accordingly, the second gate electrode 250 may be formed to surround the fourth, fifth, and sixth active patterns 212, 214, and 216. The second gate electrode 250 may be formed even in the space between the substrate 100 and the fourth active pattern 212.

The second gate electrode 250 may include a conductive material. The second gate electrode 250 may include the same material as, or a different material from, the first gate electrode 150. The second gate electrode 250 may be formed by, for example, a replacement process, but the present disclosure is not limited thereto.

The second gate dielectric film 260 may be interposed between the fourth active pattern 212 and the second gate electrode 250, between the fifth active pattern 214 and the second gate electrode 250, and between the sixth active pattern 216 and the second gate electrode 250. The second gate dielectric film 260 may include at least one of, for example, silicon oxide, silicon oxynitride, silicon nitride, or a high-k material having a greater dielectric constant than silicon oxide.

The second epitaxial patterns 240 may be formed on the second region II of the substrate 100. Also, the second epitaxial patterns 240 may be formed on the side surfaces of the second gate electrode 250. For example, as illustrated in FIG. 11, second source/drain trenches 240t, which are defined by the top surface of the second fin-type protrusion 210, may be formed on the side surfaces of the second gate electrode 250. The second epitaxial patterns 240 may be formed in the second source/drain trenches 240t.

The second epitaxial patterns 240 may be spaced apart from the second gate electrode 250 by gate spacers 130. Also, the second epitaxial patterns 240 may be connected to the fourth, fifth, and sixth active patterns 212, 214, and 216. For example, the fourth, fifth, and sixth active patterns 212, 214, and 216 may be connected to the second epitaxial patterns 240 through the gate spacers 130. The second epitaxial patterns 240 may be used as source/drain regions of the transistor including the second gate electrode 250.

In some embodiments, cross sections of the second epitaxial patterns 240 that intersect the fourth direction X2 may have a diamond (or a pentagonal or hexagonal shape), but the present disclosure is not limited thereto. That is, cross sections of the second epitaxial patterns 240 that intersect the fourth direction X2 may have various other shapes.

In some embodiments, the second epitaxial patterns 240 may protrude beyond the top surface of the uppermost active pattern (e.g., the sixth active pattern 216) among the fourth, fifth, and sixth active patterns (212, 214, and 216) that penetrate the second gate electrode 250. For example, the second epitaxial patterns 240 may be elevated source/drain regions whose top surfaces protrude beyond the top surface of the sixth active pattern 216.

In some embodiments, the first region I may be an NMOS region, and the second region II may be a PMOS region. For example, the first epitaxial patterns 140 may include n-type impurities, and the second epitaxial patterns 240 may include p-type impurities.

The gate spacers 130 may be formed on the second region II of the substrate 100 and on the second field insulating film 205. The gate spacers 130 may extend along side surfaces of the second gate electrode 250. The gate spacers 130 may electrically insulate the second gate electrode 250 and the second epitaxial patterns 240.

The fourth, fifth, and sixth active patterns 212, 214, and 216 may extend in the fourth direction X2 and may penetrate the gate spacers 130. The gate spacers 130 may be disposed at and/or adjacent the ends of each of the fourth, fifth, and sixth active patterns 212, 214, and 216. The gate spacers 130 may be formed to surround the ends of each of the fourth, fifth, and sixth active patterns 212, 214, and 216.

In some embodiments, the second gate dielectric film 260 may further extend along inner side surfaces of the gate spacers 130. For example, the second gate dielectric film 260 may extend conformally between the second gate electrode 250 and the fourth active pattern 212, between the second gate electrode 250 and the fifth active pattern 214, between the second gate electrode 250 and the sixth active pattern 216, and/or between the second gate electrode 250 and the gate spacers 130.

In some embodiments, parts of outer side surfaces of the second gate dielectric film 260 may be in contact with first outer spacers 132 of the gate spacers 130, and other parts of the outer side surfaces of the second gate dielectric film 260 may be in contact with the second epitaxial patterns 240.

The first outer spacers 132 may be formed on the side surfaces of the second gate electrode 250. For example, the first outer spacers 132 may extend conformally along the side surfaces of the second gate electrode 250. In some embodiments, the first outer spacers 132 may extend along the outer side surfaces of the second gate dielectric film 260. In some embodiments, the first outer spacers 132 may be in contact with the outer side surfaces of the second gate dielectric film 260.

In a cross section that intersects the fourth direction X2, the first outer spacers 132 may surround the fourth, fifth, and sixth active patterns 212, 214, and 216. For example, in a cross section that intersects the fourth direction X2, the fourth, fifth, and sixth active patterns 212, 214, and 216 and the second gate dielectric film 260 may be formed in the first outer spacers 132.

Third outer spacers 136 of the gate spacers 130 may be formed on outer side surfaces of the first outer spacers 132. For example, the third outer spacers 136 may be on and/or cover the outer side surfaces of the first outer spacers 132.

Also, the third outer spacers 136 may be on and/or cover the first outer spacers 132, the second epitaxial patterns 240, and the second field insulating film 205. For example, the third outer spacers 136 may extend conformally along the outer side surfaces of the first outer spacers 132, the circumferences and/or perimeters of the second epitaxial patterns 240, and the top surface of the second field insulating film 205. For example, as illustrated in FIG. 12, the third outer spacers 136 may extend conformally on the outer side surfaces of the first outer spacers 132 and the top surfaces of the second epitaxial patterns 240.

An interlayer insulating film 180 may be formed on the second region II of the substrate 100 and on the second field insulating film 205. The interlayer insulating film 180 may be formed to fill spaces on the side surfaces of the second gate electrode 250. For example, the interlayer insulating film 180 may be formed to be on and/or cover the third outer spacers 136.

Referring to FIGS. 11 and 13, the length of the fourth, fifth, and sixth active patterns (212, 214, and 216) that penetrate the second gate electrode 250 decreases and then increases away from the substrate.

Here, the length of the fourth, fifth, and sixth active patterns (212, 214, and 216) denotes the length, in the fourth direction X2, of the fourth, fifth, and sixth active patterns (212, 214, and 216). For example, the length of the fourth active pattern 212 may be greater than the length of the fifth active pattern 214, and the length of the fifth active pattern 214 may be smaller than the length of the sixth active pattern 216.

In some embodiments, the length of the fourth active pattern 212 may gradually decrease away from the top surface of the substrate 100. In some embodiments, the length of the fifth active pattern 214 may decrease and then increase away from the top surface of the substrate 100. In some embodiments, the length of the sixth active pattern 216 may gradually increase away from the top surface of the substrate 100.

A method of fabricating a semiconductor device according to some embodiments of the present disclosure will hereinafter be described with reference to FIGS. 11 and 14 to 30.

FIGS. 14 to 30 illustrate steps of a method of fabricating a semiconductor device according to some embodiments of the present disclosure. For convenience, descriptions of elements or features that have already been described above with reference to FIGS. 1 to 13 will be omitted or simplified.

Figure 14:
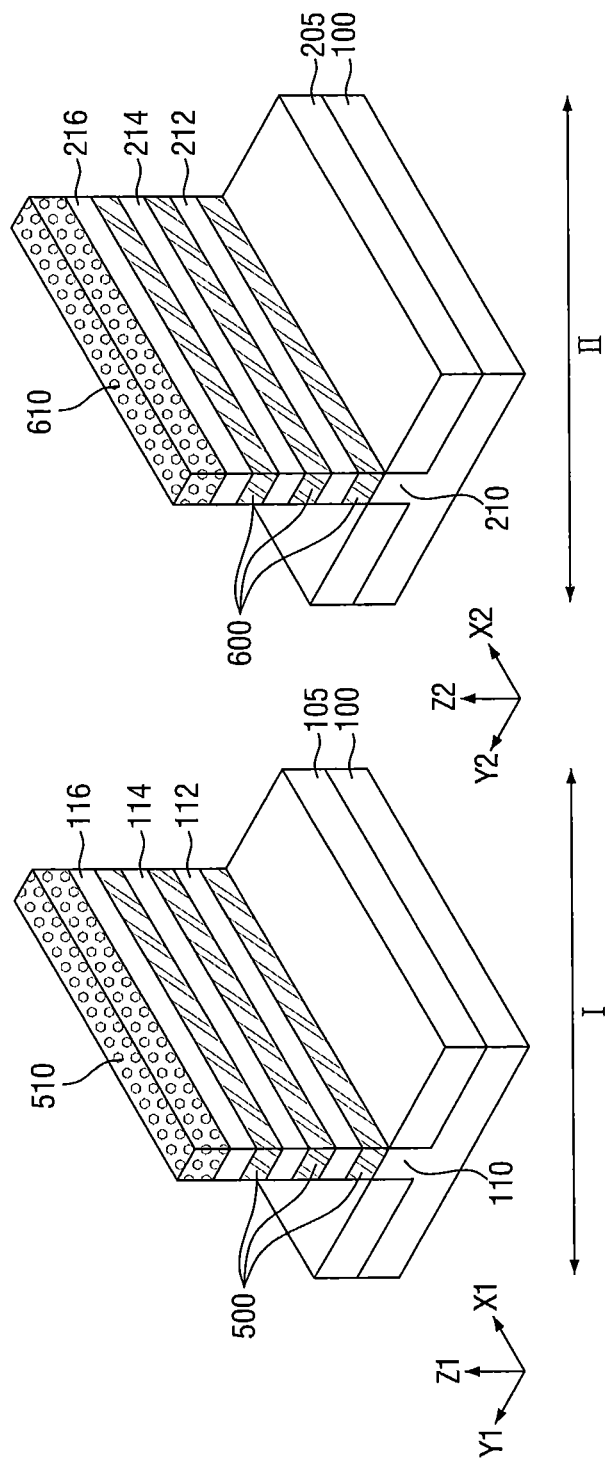
FIGS. 14 to 30 illustrate steps of a method of fabricating a semiconductor device according to some embodiments of the present disclosure.

Referring to FIG. 14, first, second, and third active patterns 112, 114, and 116, first sacrificial patterns 500, fourth, fifth, and sixth active patterns 212, 214, and 216, and second sacrificial patterns 600 are formed on a substrate 100.

For example, first and second semiconductor material films may be formed on a first region I of the substrate 100 to be alternately stacked. Thereafter, a first mask pattern 510, which extends in a first direction X1, may be formed on the first and second semiconductor material films. Thereafter, the first and second semiconductor material films may be patterned using the first mask pattern 510 as an etching mask. The patterned second semiconductor material film may form the first, second, and third active patterns 112, 114, and 116. The patterned first semiconductor material film may form the first sacrificial patterns 500, which are interposed between the first, second, and third active patterns 112, 114, and 116.

Also, for example, third and fourth semiconductor material films may be formed on a second region II of the substrate 100 to be alternately stacked. Thereafter, a second mask pattern 610, which extends in a fourth direction X2, may be formed on the third and fourth semiconductor material films. Thereafter, the third and fourth semiconductor material films may be patterned using the second mask pattern 610 as an etching mask. The patterned fourth semiconductor material film may form the fourth, fifth, and sixth active patterns 212, 214, and 216. The patterned third semiconductor material film may form the second sacrificial patterns 600, which are interposed between the fourth, fifth, and sixth active patterns 212, 214, and 216.

In some embodiments, the first and second semiconductor material films may have different etching selectivities, and the third and fourth semiconductor material films may have different etching selectivities. For example, the first and third semiconductor material films may include silicon germanium (SiGe), and the second and fourth semiconductor material films may include silicon (Si). However, the present disclosure is not limited to this example.

In some embodiments, a first fin-type protrusion 110 may be formed by etching part of the first region I of the substrate 100, and a second fin-type protrusion 210 may be formed by etching part of the second region II of the substrate 100.

Thereafter, a first field insulating film 105 may be formed on the first region I of the substrate 100, and a second field insulating film 205 may be formed on the second region II of the substrate 100. The first field insulating film 105 may surround at least parts of side surfaces of the first fin-type protrusion 110, and the second field insulating film 205 may surround at least parts of side surfaces of the second fin-type protrusion 210.

Figure 15:
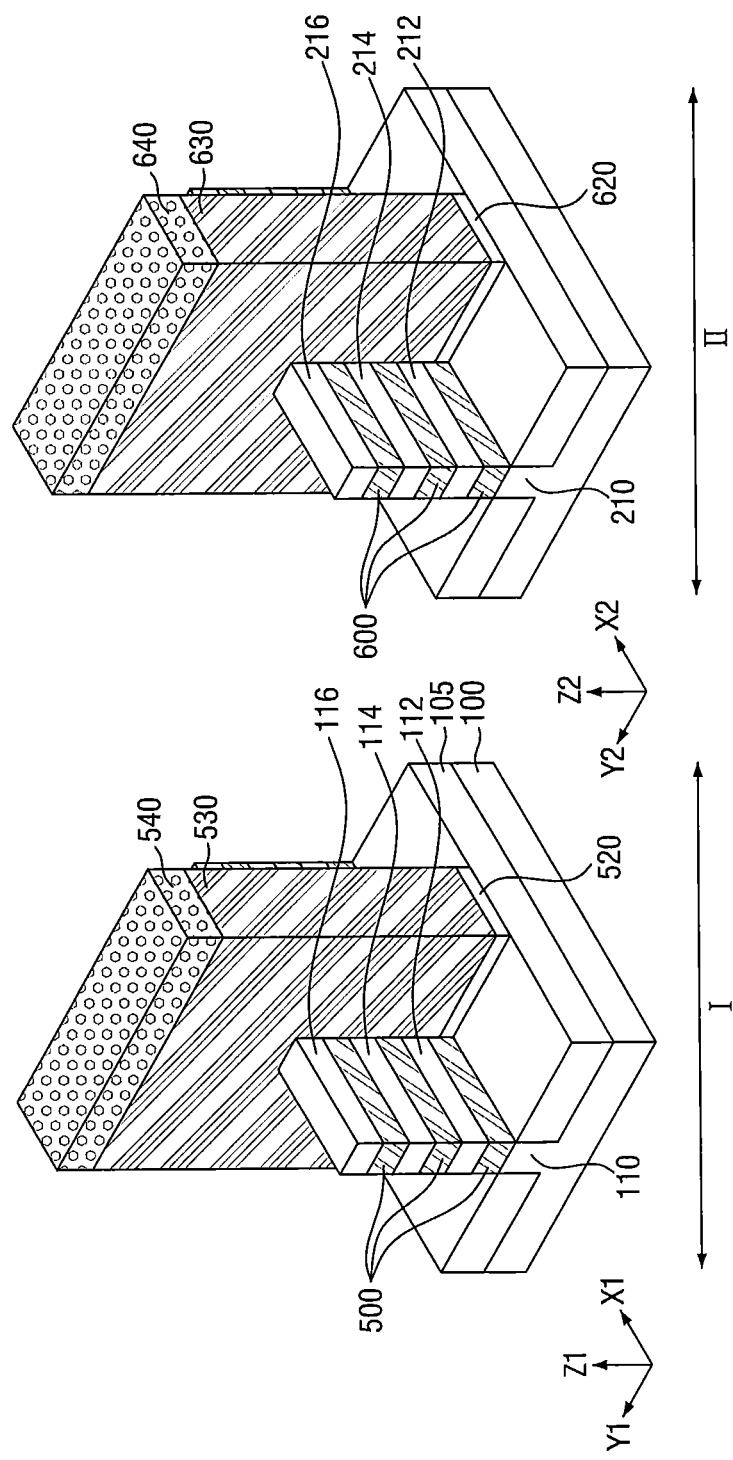

Referring to FIG. 15, a first dummy gate electrode 530 is formed on the first region I of the substrate 100, and a second dummy gate electrode 630 is formed on the second region II of the substrate 100.

For example, a first conductive material film may be formed on the first region I of the substrate 100 and on the first field insulating film 105. Thereafter, a third mask pattern 540, which extends in a second direction Y1, may be formed on the first conductive material film. Thereafter, the first conductive material film may be patterned using the third mask pattern 540 as an etching mask. The patterned first conductive material film may form a first dummy gate electrode 530. That is, the first dummy gate electrode 530, which intersects the first, second, and third active patterns 112, 114, and 116 and the first sacrificial patterns 500, may be formed. In some embodiments, a first dummy gate dielectric film 520 may be further formed on the first region I of the substrate 100 and on the first field insulating film 105 (e.g., between the first conductive material film and the first field insulating film 105).

Also, for example, a second conductive material film may be formed on the second region II of the substrate 100 and on the second field insulating film 205. Thereafter, a fourth mask pattern 640, which extends in a fifth direction Y2, may be formed on the second conductive material film. Thereafter, the second conductive material film may be patterned using the fourth mask pattern 640 as an etching mask. The patterned second conductive material film may form a second dummy gate electrode 630. That is, the second dummy gate electrode 630, which intersects the fourth, fifth, and sixth active patterns 212, 214, and 216 and the second sacrificial patterns 600, may be formed. In some embodiments, a second dummy gate dielectric film 620 may be further formed on the second region II of the substrate 100 and on the second field insulating film 205 (e.g., between the second conductive material film and the second field insulating film 205).

The first dummy gate electrode 530 may include a material having a different etching selectivity from the first, second, and third active patterns 112, 114, and 116 and from the first sacrificial patterns 500, and the second dummy gate electrode 630 may include a material having a different etching selectivity from the fourth, fifth, and sixth active patterns 212, 214, and 216 and from the second sacrificial patterns 600. For example, the first and second dummy gate electrodes 530 and 630 may include polysilicon (poly-Si), but the present disclosure is not limited thereto.

Figure 16:
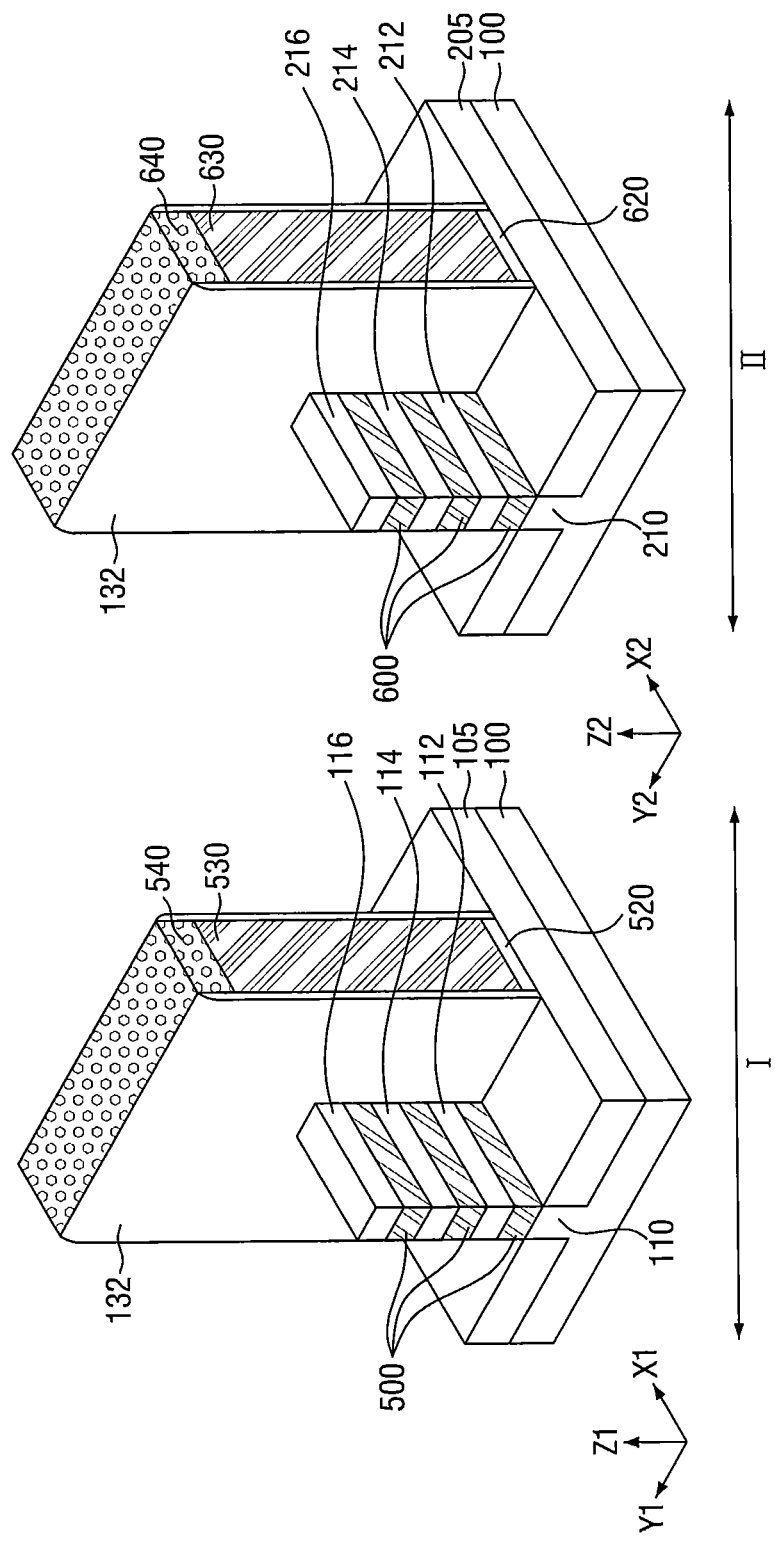

Referring to FIG. 16, first outer spacers 132 are formed on the first and second regions I and II of the substrate 100.

The first outer spacers 132 may be formed on side surfaces of the first dummy gate electrode 530 and side surfaces of the second dummy gate electrode 630. For example, the first outer spacers 132 may extend conformally along the side surfaces of the first dummy gate electrode 530 and the side surfaces of the second dummy gate electrode 630.

In some embodiments, the first outer spacers 132 may include at least one of SiON, SiCN, SiC, SiOC, SiBN, SiBCN, and SiOCN.

Figure 17:
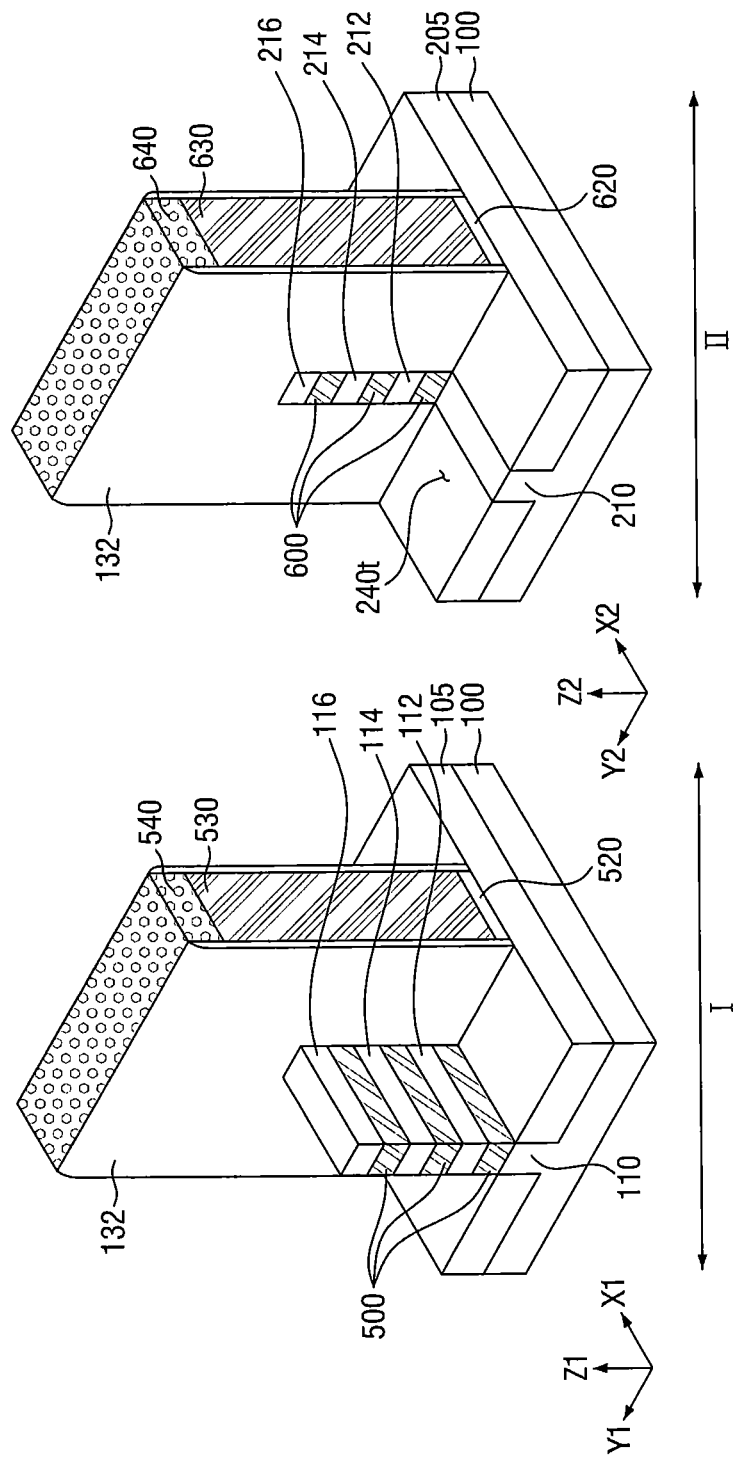

Referring to FIG. 17, second source/drain trenches 240t are formed on the second region II of the substrate 100.

For example, the fourth, fifth, and sixth active patterns 212, 214, and 216 and the second sacrificial patterns 600 may be etched using the first outer spacers 132 of the second region II as an etching mask. As a result, second source/drain trenches 240t, which are defined by the top surface of the second fin-type protrusion 210, may be formed on the side surfaces of a second dummy gate electrode 630.

As the second source/drain trenches 240t are formed, the fourth, fifth, and sixth active patterns 212, 214, and 216 and the second sacrificial patterns 600 may be exposed by the first outer spacers 132 of the second region II.

Figure 18:
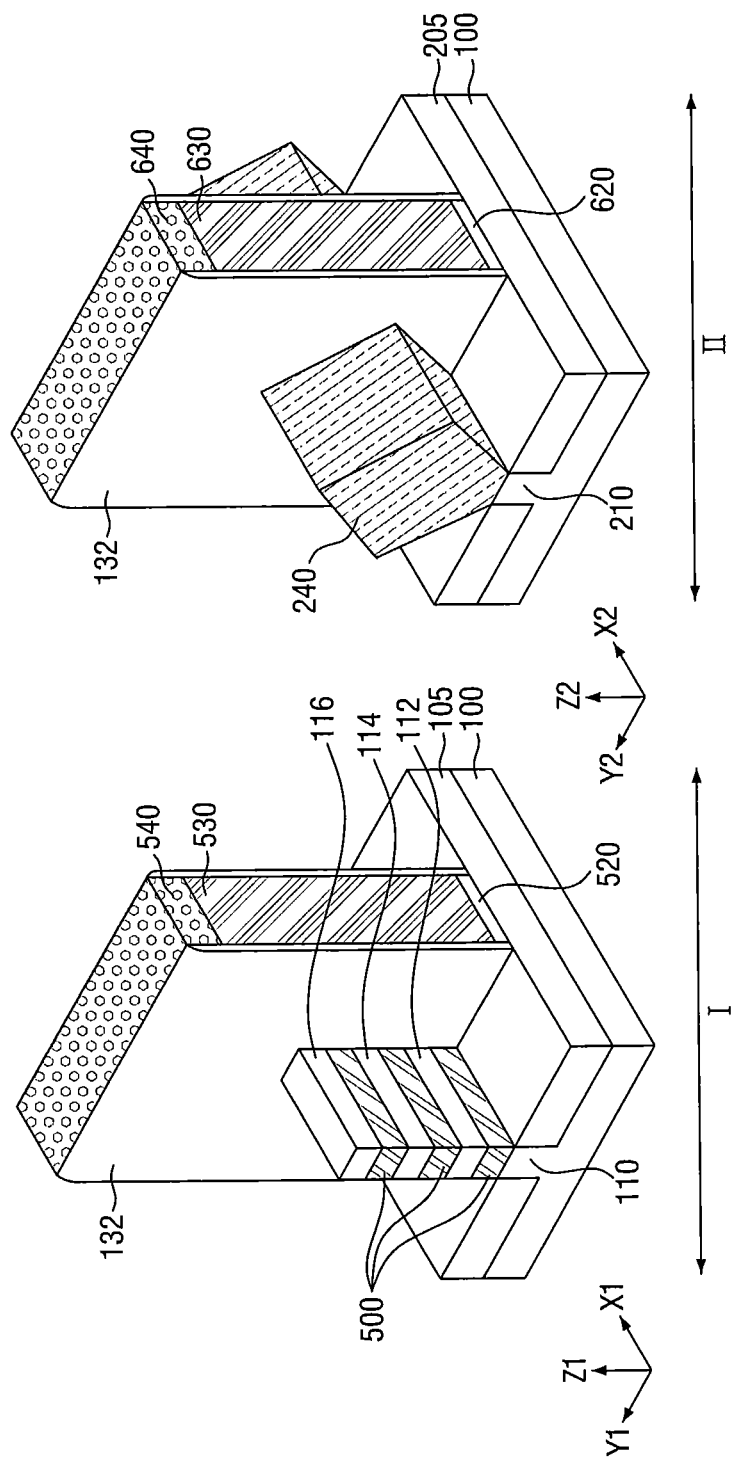

Referring to FIG. 18, second epitaxial patterns 240 are formed on the second region II of the substrate 100.

For example, the second epitaxial patterns 240 may be formed in the second source/drain trenches 240t. That is, the second epitaxial patterns 240, which are connected to the fourth, fifth, and sixth active patterns 212, 214, and 216, may be formed. The second epitaxial patterns 240 may be formed by, for example, an epitaxial growth method, but the present disclosure is not limited thereto. In some embodiments, the second region II may be a PMOS region. For example, the second epitaxial patterns 240 may include p-type impurities.

Figure 19:
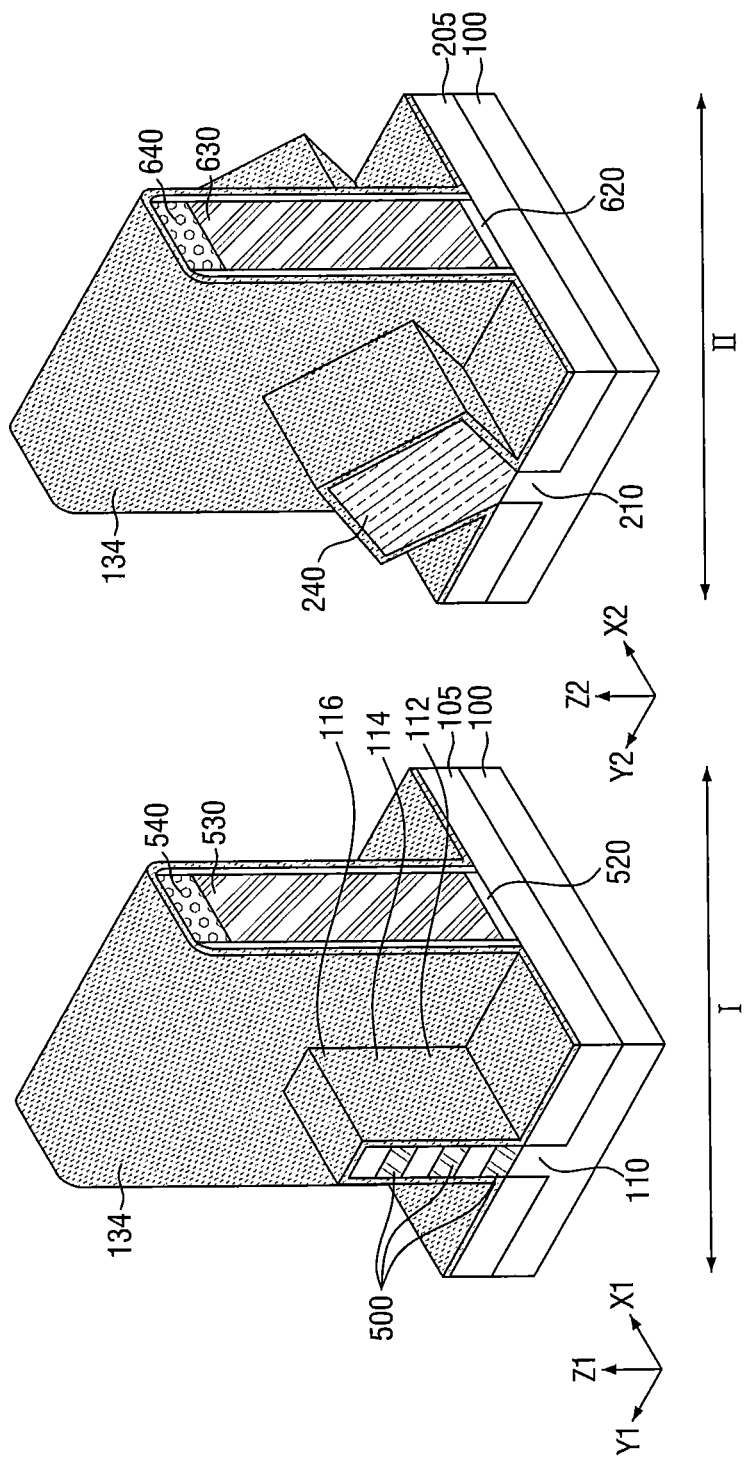

Referring to FIG. 19, second outer spacers 134 are formed on the first and second regions I and II of the substrate 100.

The second outer spacers 134 may be formed to cover the structure illustrated in FIG. 18. For example, the second outer spacers 134 may extend conformally along the top surface of the first field insulating film 105, the circumferences and/or perimeters of the first, second, and third active patterns 112, 114, and 116, the circumferences and/or perimeters of the first sacrificial patterns 500, and outer side surfaces of the first outer spacers 132 of the first region I. Also, the second outer spacers 134 may extend conformally along the top surface of the second field insulating film 205, the circumferences and/or perimeters of the second epitaxial patterns 240, and outer side surfaces of the first outer spacers 132 of the second region II.

The second outer spacers 134 may include a different material from the first outer spacers 132. In some embodiments, the second outer spacers 134 may include silicon nitride (e.g., $Si_3N_4$). Accordingly, the second outer spacers 134 may have a different etching selectivity from the first outer spacers 132. In subsequent processes, the second outer spacers 134 may have a relatively low etching selectivity.

In some embodiments, the dielectric constant of the second outer spacers 134 may be greater than the dielectric constant of the first outer spacers 132. For example, the second outer spacers 134 may have a dielectric constant of about 6 or greater, and the first outer spacers 132 may have a dielectric constant of about 5 or less.

Figure 20:
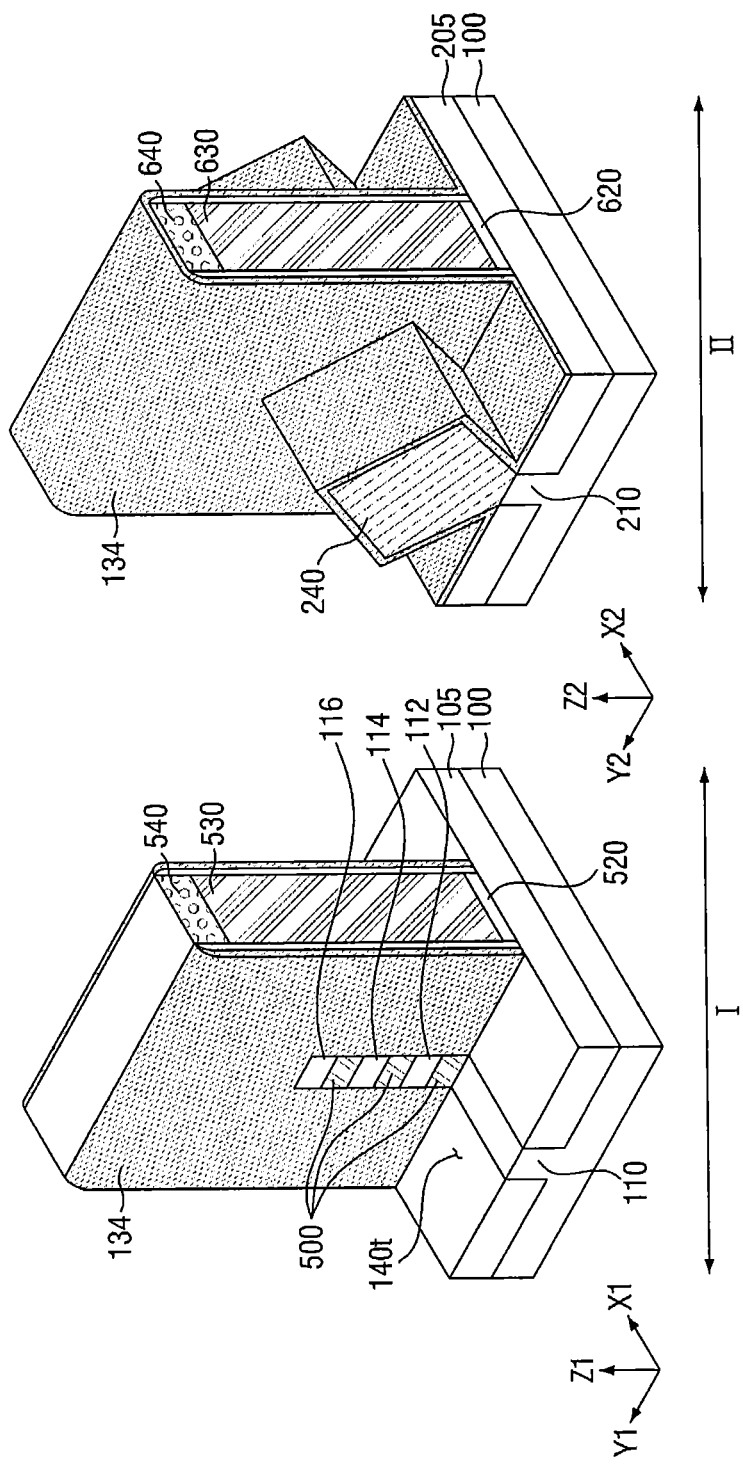

Referring to FIG. 20, first source/drain trenches 140t are formed on the first region I of the substrate 100.

For example, the first, second, and third active patterns 112, 114, and 116 and the first sacrificial patterns 500 may be etched using the second outer spacers 134 of the first region I as an etching mask. As a result, the first source/drain trenches 140t, which are defined by the top surface of the first fin-type protrusion 110, may be formed on side surfaces of a first dummy gate electrode 530.

As the first source/drain trenches 140t are formed, the first, second, and third active patterns 112, 114, and 116 and the first sacrificial patterns 500 may be exposed by the second outer spacers 134 of the first region I.

Figure 21:
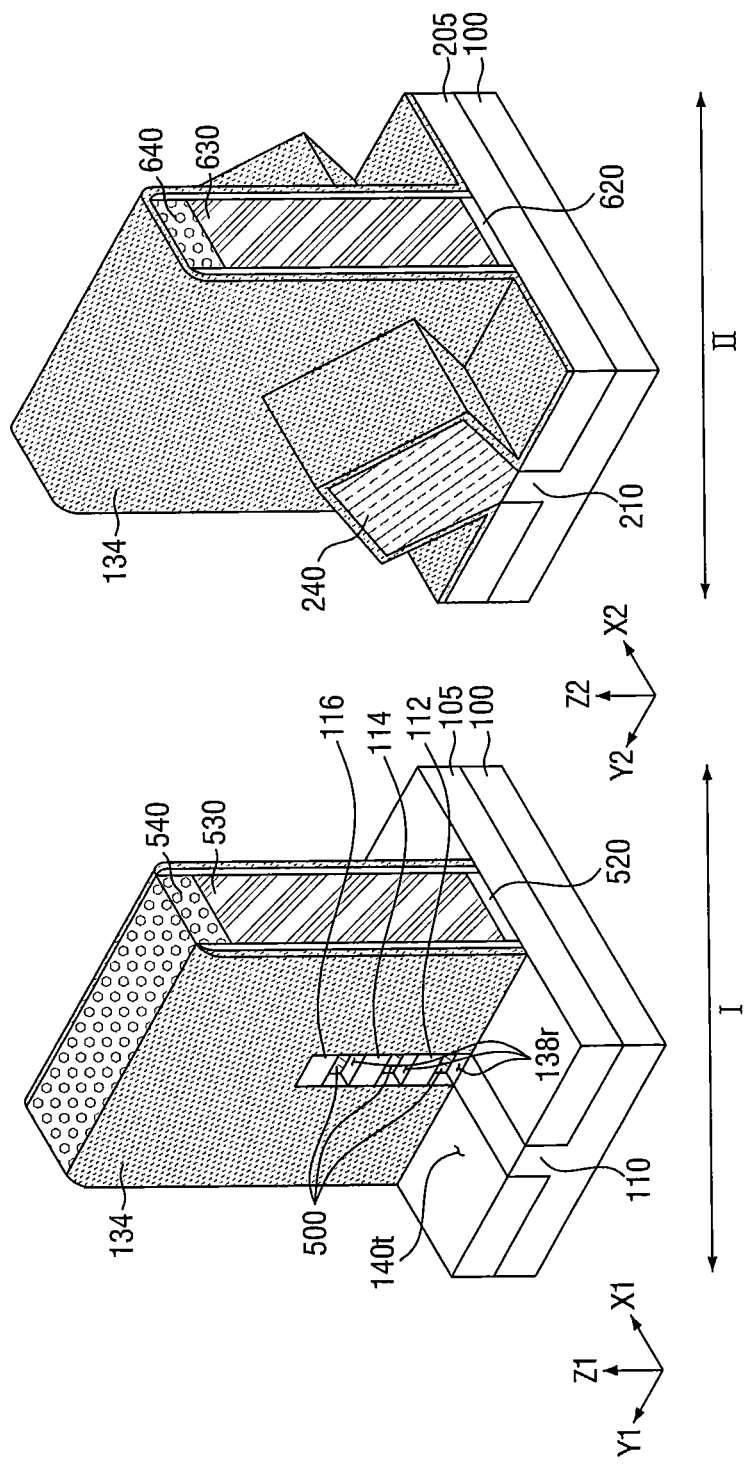

Referring to FIG. 21, a recess process is performed on the first sacrificial patterns 500.

For example, parts of the first sacrificial patterns 500 that are exposed by the second outer spacers 134 of the first region I may be removed. As a result, spacer recesses 138r may be formed between the first, second, and third active patterns 112, 114, and 116.

Figure 22:
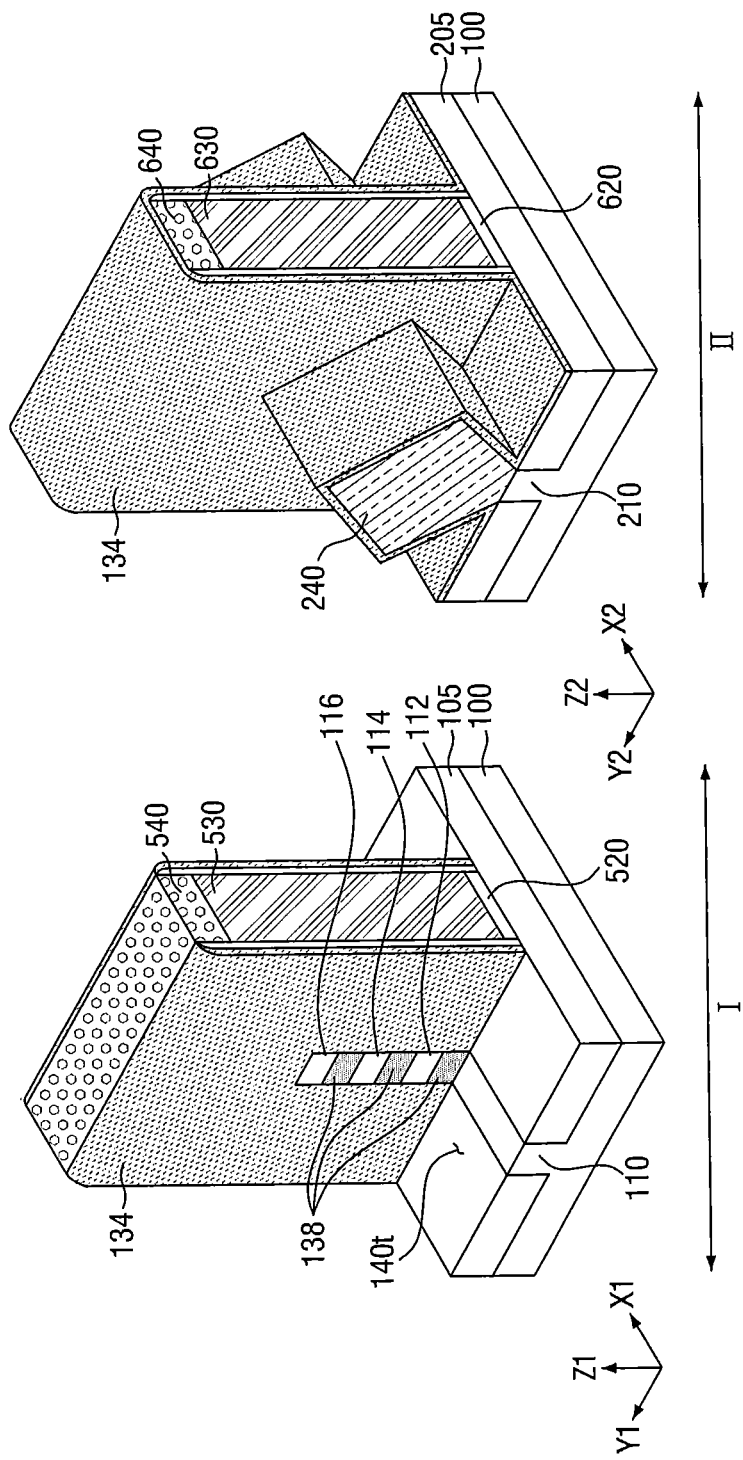

Referring to FIG. 22, inner spacers 138 are formed in the spacer recesses 138r.

For example, a spacer insulating film may be formed on outer side surfaces of the second outer spacers 134 to fill the spacer recesses 138r. Thereafter, a recess process may be performed on the spacer insulating film until the outer side surfaces of the second outer spacers 134 are exposed. As a result, the inner spacers 138, which fill the spacer recesses 138r, may be formed.

The inner spacers 138 may have a relatively small dielectric constant. For example, the dielectric constant of the inner spacers 138 may be smaller than the dielectric constant of the second outer spacers 134. For example, the inner spacers 138 may have a dielectric constant of about 5 or less. Accordingly, the parasitic capacitance caused by the inner spacers 138 can be reduced, and a semiconductor device with improved operating characteristics can be provided.

In some embodiments, the inner spacers 138 may include at least one of, for example, SiON, SiCN, SiC, SiOC, SiBN, SiBCN, and SiOCN.

As already mentioned above, since the second outer spacers 134 have a relatively low etching selectivity, the yield of a semiconductor device can be improved in the process of forming the inner spacers 138. If the second outer spacers 134 and the inner spacers 138 include similar materials (e.g., if the second outer spacers 134 and the inner spacers 138 have similar dielectric constants) and thus have similar etching selectivities, parts of the second outer spacers 134 of the second region II may be etched in the process of forming the inner spacers 138. For example, during the recess process for the spacer insulating film, parts of the second outer spacers 134 that cover the circumferences and/or perimeters of the second epitaxial patterns 240 may be removed so that parts of the second epitaxial patterns 240 may be exposed. This may cause the formation of parasitic epitaxial patterns in the process of forming first epitaxial patterns 140 and may thus lower the yield of a semiconductor device.

However, since the second outer spacers 134 have a relatively low etching selectivity, the second outer spacers 134 can be prevented from being accidentally removed in the process of forming the inner spacers 138. As a result, a semiconductor device with an improved yield can be provided.

Figure 23:
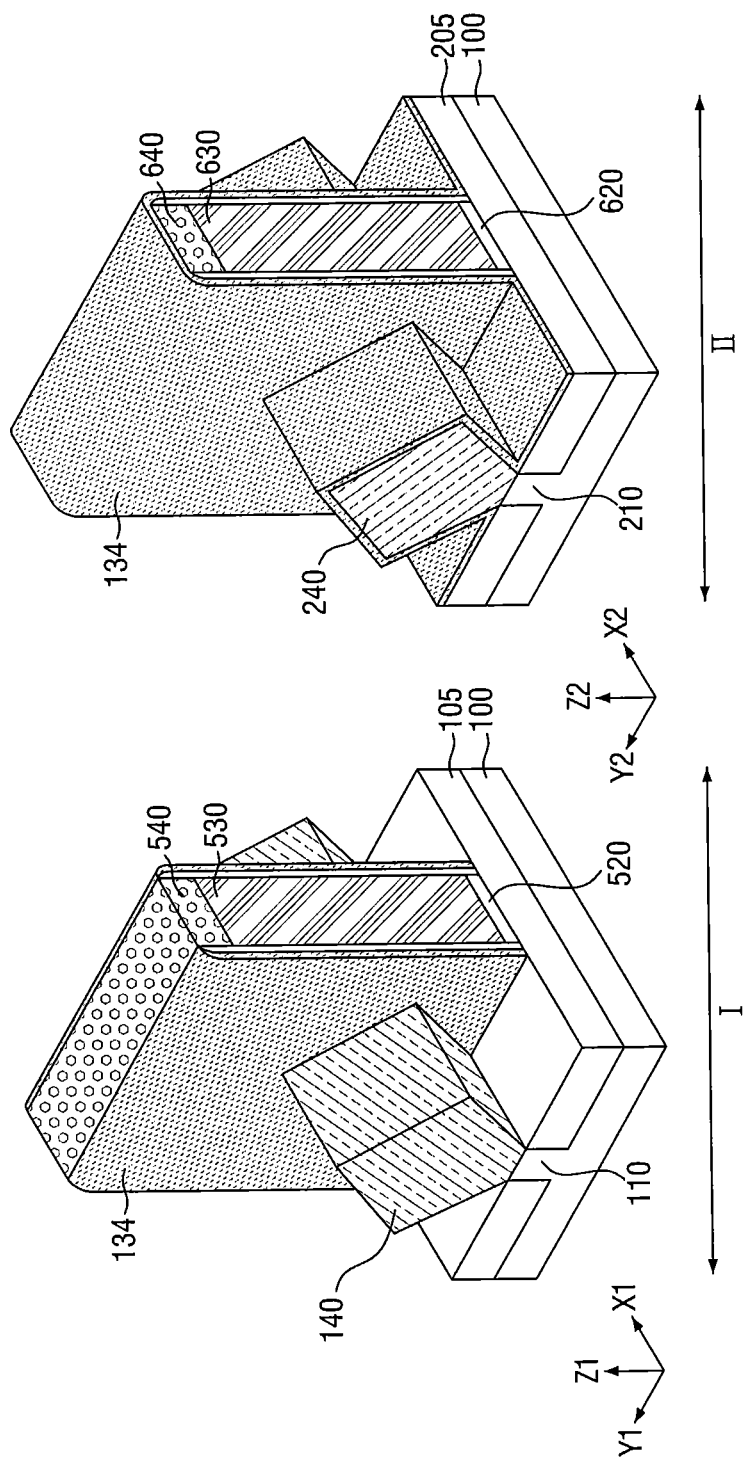

Referring to FIG. 23, the first epitaxial patterns 140 are formed on the first region I of the substrate 100.

For example, the first epitaxial patterns 140 may be formed in the first source/drain trenches 140t. That is, the first epitaxial patterns 140, which are connected to the first, second, and third active patterns 112, 114, and 116, may be formed. The first epitaxial patterns 140 may be formed by, for example, an epitaxial growth method, but the present disclosure is not limited thereto. In some embodiments, the first region I may be an NMOS region. For example, the first epitaxial patterns 140 may include n-type impurities.

Figure 24:
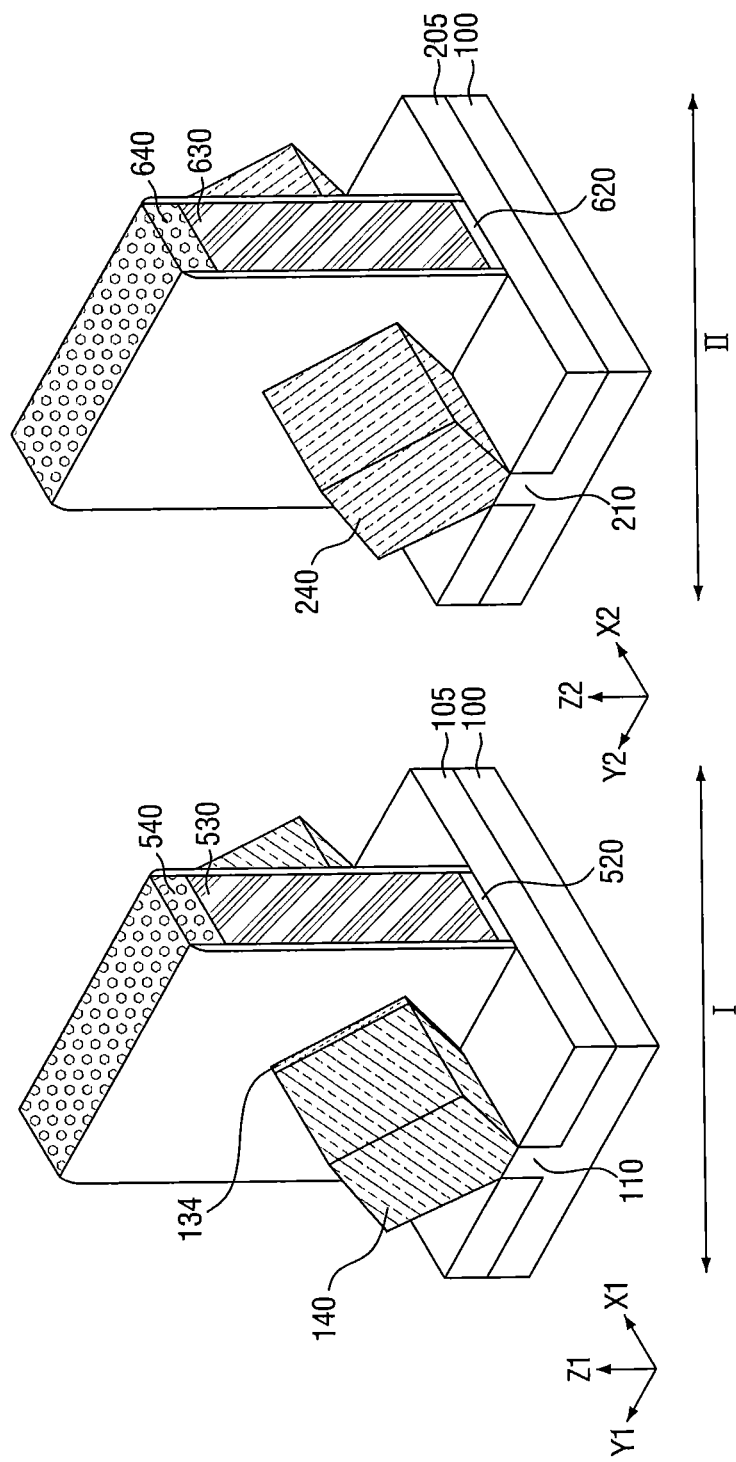

Referring to FIG. 24, a strip process is performed on the second outer spacers 134 of the first and second regions I and II.

The strip process may include, for example, a wet etching process, but the present disclosure is not limited thereto. As a result, at least parts of the second outer spacers of the first and second regions I and II may be removed.

Parts of the second outer spacers 134 of the first region I may be removed by the strip process. For example, the second outer spacers 134 interposed between the first epitaxial patterns 140 and the first outer spacers 132 may not be removed, but remain.

In some embodiments, the second outer spacers 134 of the first region I may remain in the same shape as the first epitaxial patterns 140. For example, the circumferences and/or perimeters of cross sections of the second outer spacers 134 that intersect the first direction X1 may have the same shape as the circumferences and/or perimeters of cross sections of the first epitaxial patterns 140 that intersect the first direction X1.

In some embodiments, the size of the remaining second outer spacers 134 of the first region I may be the same as, or smaller than, the size of the first epitaxial patterns 140. For example, the size of the circumferences and/or perimeters of the cross sections of the second outer spacers 134 that intersect the first direction X1 may be the same as, or smaller than, the size of the circumferences and/or perimeters of the cross sections of the first epitaxial patterns 140 that intersect the first direction X1.

In some embodiments, the second outer spacers 134 of the second region II may be completely removed.

Figure 25:
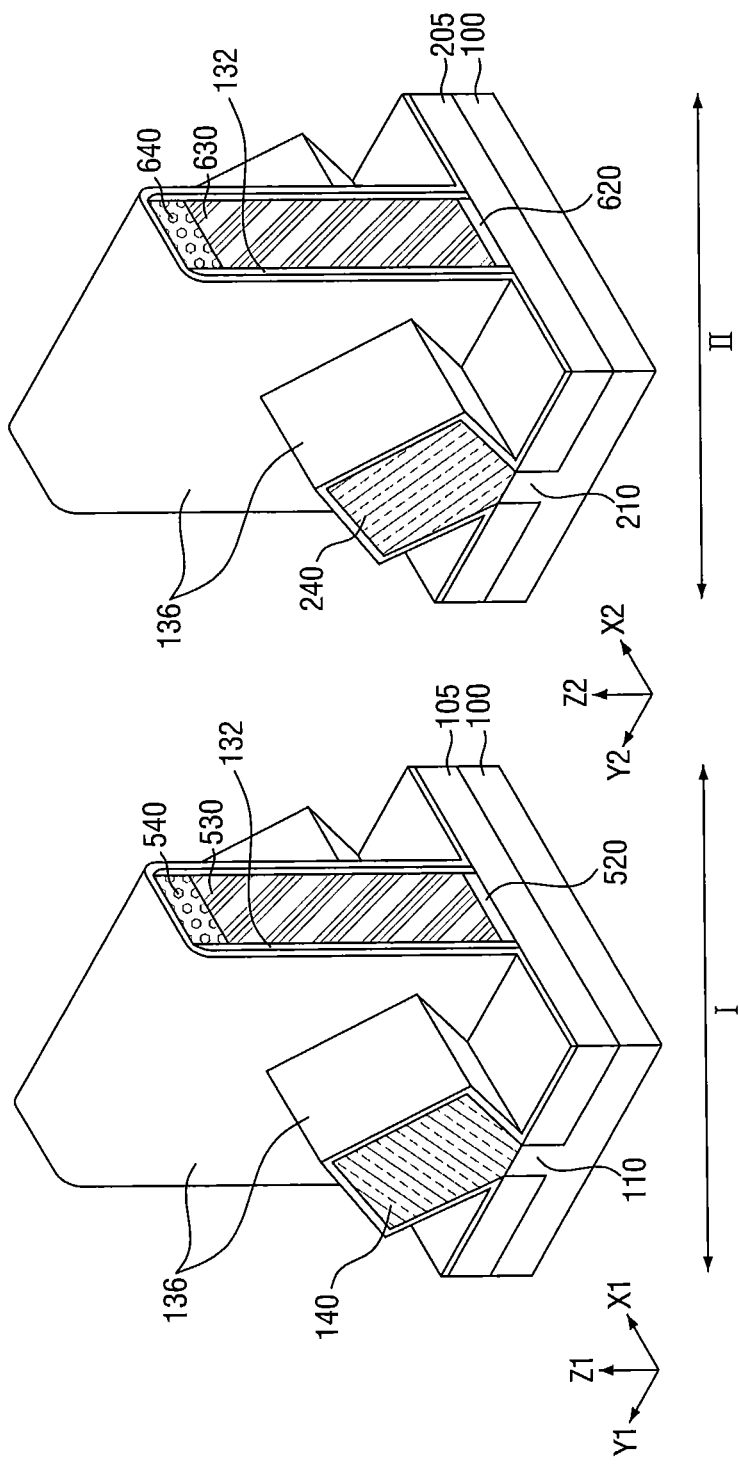

Referring to FIG. 25, third outer spacers 136 are formed on the first and second regions I and II of the substrate 100.

The third outer spacers 136 may be formed to cover the structure illustrated in FIG. 24. For example, the third outer spacers 136 may extend conformally along the top surface of the first field insulating film 105, the circumferences and/or perimeters of the first epitaxial patterns 140, the circumferences and/or perimeters of the second outer spacers 134, and the outer side surfaces of the first outer spacers 132 of the first region I. Also, the third outer spacers 136 may extend conformally along the top surface of the second field insulating film 205, the circumferences and/or perimeters of the second epitaxial patterns 240, and the outer side surfaces of the first outer spacers 132 of the second region II.

The third outer spacers 136 may have a relatively low dielectric constant. For example, the dielectric constant of the third outer spacers 136 may be smaller than the dielectric constant of the second outer spacers 134. For example, the third outer spacers 136 may have a dielectric constant of about 5 or less. Accordingly, the parasitic capacitance caused by the third outer spacers 136 can be reduced, and a semiconductor device with improved operating characteristics can be provided.

In some embodiments, the third outer spacers 136 may include at least one of, for example, SiON, SiCN, SiC, SiOC, SiBN, SiBCN, and SiOCN.

Figure 26:
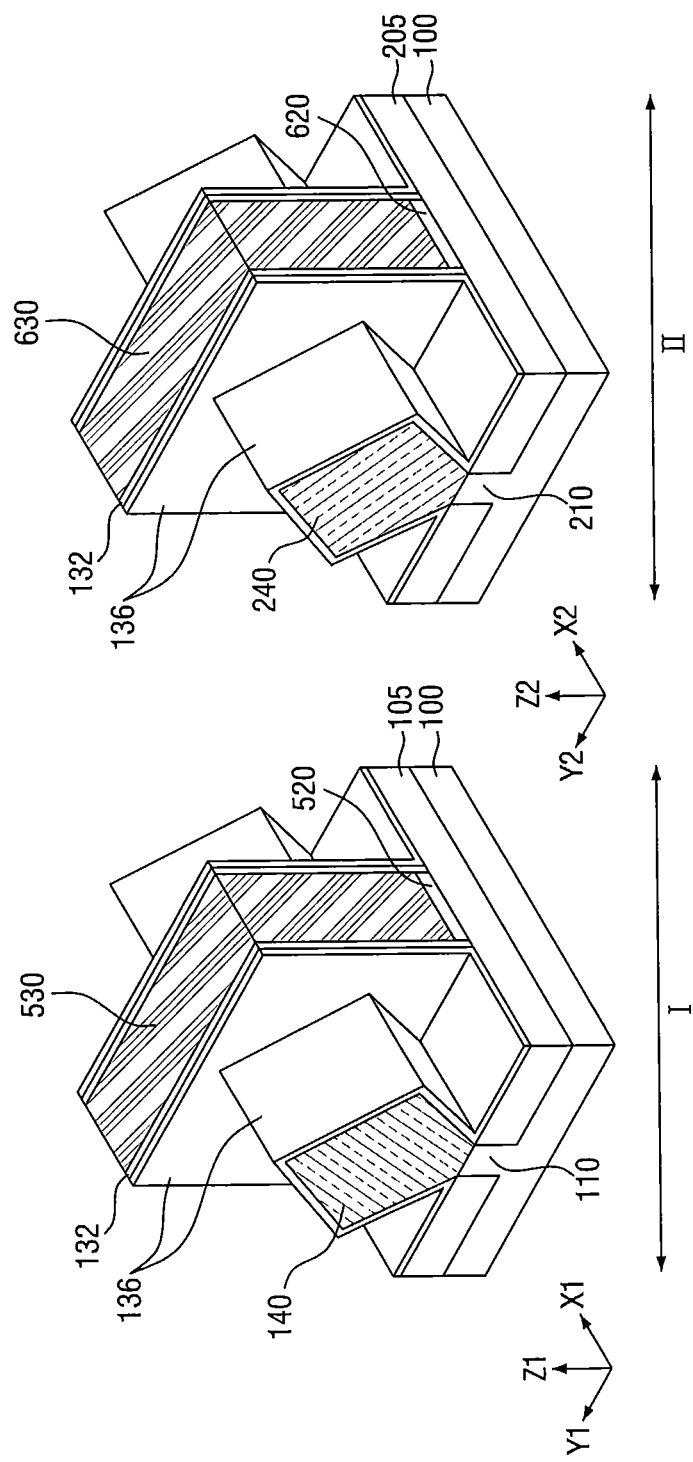

Referring to FIG. 26, the top surfaces of the first and second dummy gate electrodes 530 and 630 are exposed.

For example, a planarization process that exposes the top surfaces of the first and second dummy gate electrodes 530 and 630 may be performed. The planarization process may include, for example, a chemical mechanical polishing (CMP) process, but the present disclosure is not limited thereto.

Figure 27:
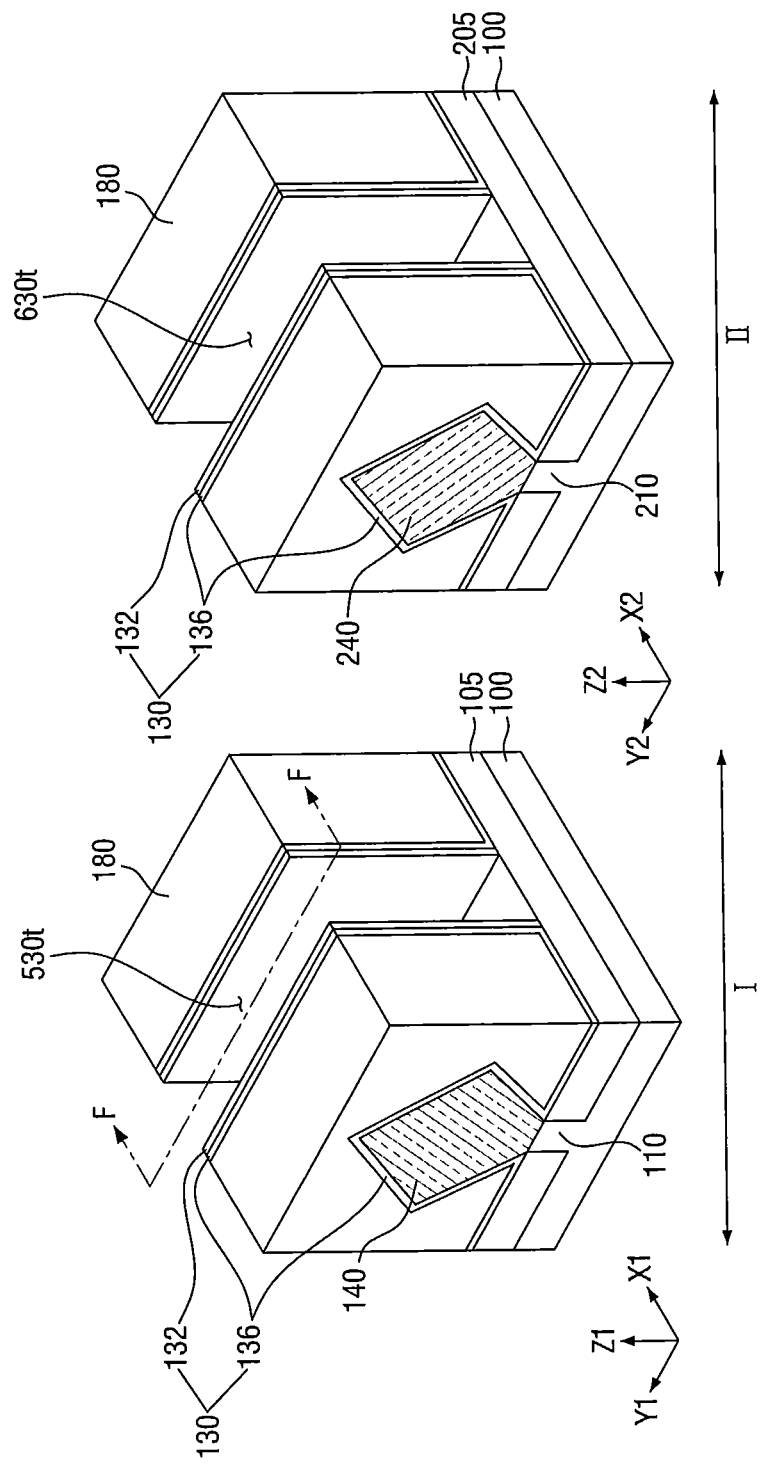
Figure 28:
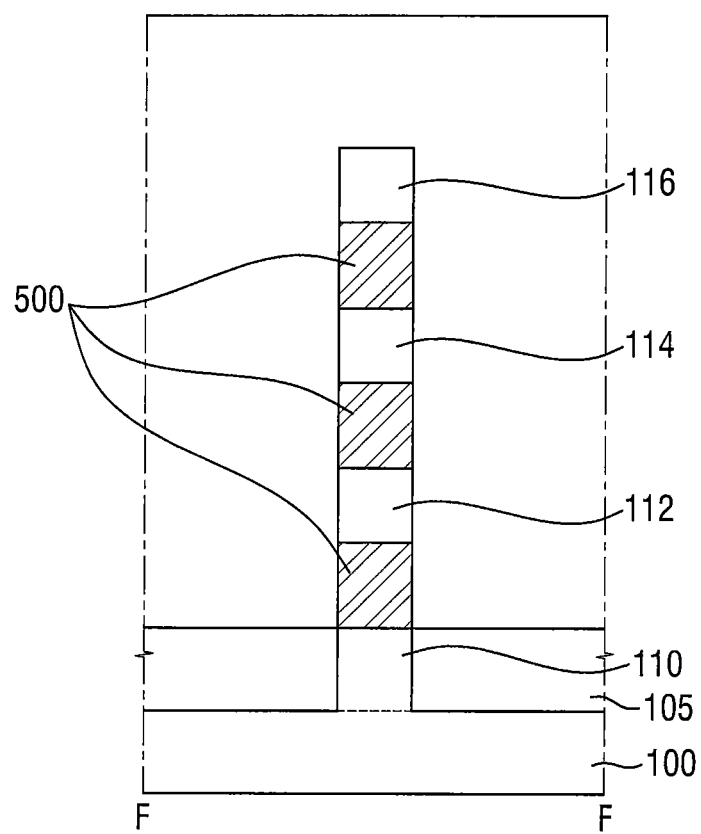

Referring to FIGS. 27 and 28, the exposed first and second dummy gate electrodes 530 and 630 are removed. FIG. 28 is a cross-sectional view taken along line F-F of FIG. 27.

For example, an interlayer insulating film 180 is formed on the first and second regions I and II of the substrate 100. The interlayer insulating film 180 may be formed to fill spaces on the side surfaces of the first dummy gate electrode 530 and spaces on the side surfaces of the second dummy gate electrode 630. For example, the interlayer insulating film 180 may be formed to cover the third outer spacers 136.

Thereafter, the exposed first and second dummy gate electrodes 530 and 630 may be removed. As already mentioned above, the first dummy gate electrode 530 may include a material having a different etching selectivity from the first, second, and third active patterns 112, 114, and 116 and from the first sacrificial patterns 500, and the second dummy gate electrode 630 may include a material having a different etching selectivity from the fourth, fifth, and sixth active patterns 212, 214, and 216 and from the second sacrificial patterns 600. Accordingly, the first and second dummy gate electrodes 530 and 630 can be selectively removed. Also, the first sacrificial patterns 500 and the second sacrificial patterns 600 can be exposed.

In some embodiments, the first and second dummy gate dielectric films 520 and 620 may be removed together with the first and second dummy gate electrodes 530 and 630. A region from which the first dummy gate electrode 530 and the first dummy gate dielectric film 520 are removed may define a first gate trench 530t, and a region from which the second dummy gate electrode 630 and the second dummy gate dielectric film 620 are removed may define a second gate trench 630t.

Figure 29:
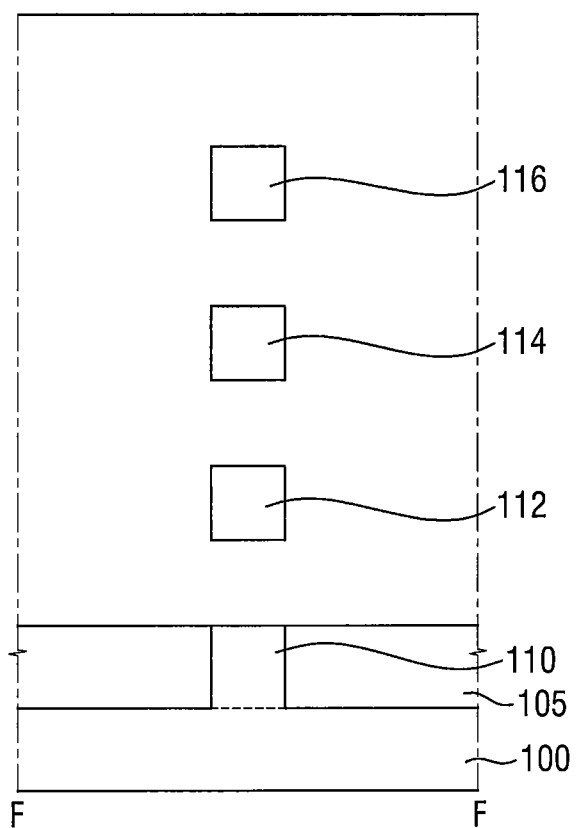

Referring to FIGS. 27 and 29, the exposed first sacrificial patterns 500 and the exposed second sacrificial patterns 600 are removed. FIG. 29 is a cross-sectional view illustrating a step to be performed after the step of FIG. 28.

As already mentioned above, the first sacrificial patterns 500 may include a material having a different etching selectivity from the first, second, and third active patterns 112, 114, and 116, and the second sacrificial patterns 600 may include a material having a different etching selectivity from the fourth, fifth, and sixth active patterns 212, 214, and 216. Thus, the first sacrificial patterns 500 and the second sacrificial patterns 600 may be selectively removed, and the first, second, and third active patterns 112, 114, and 116, which are separate from one another, and the fourth, fifth, and sixth active patterns 212, 214, and 216, which are separate from one another, may be formed.

Figure 30:
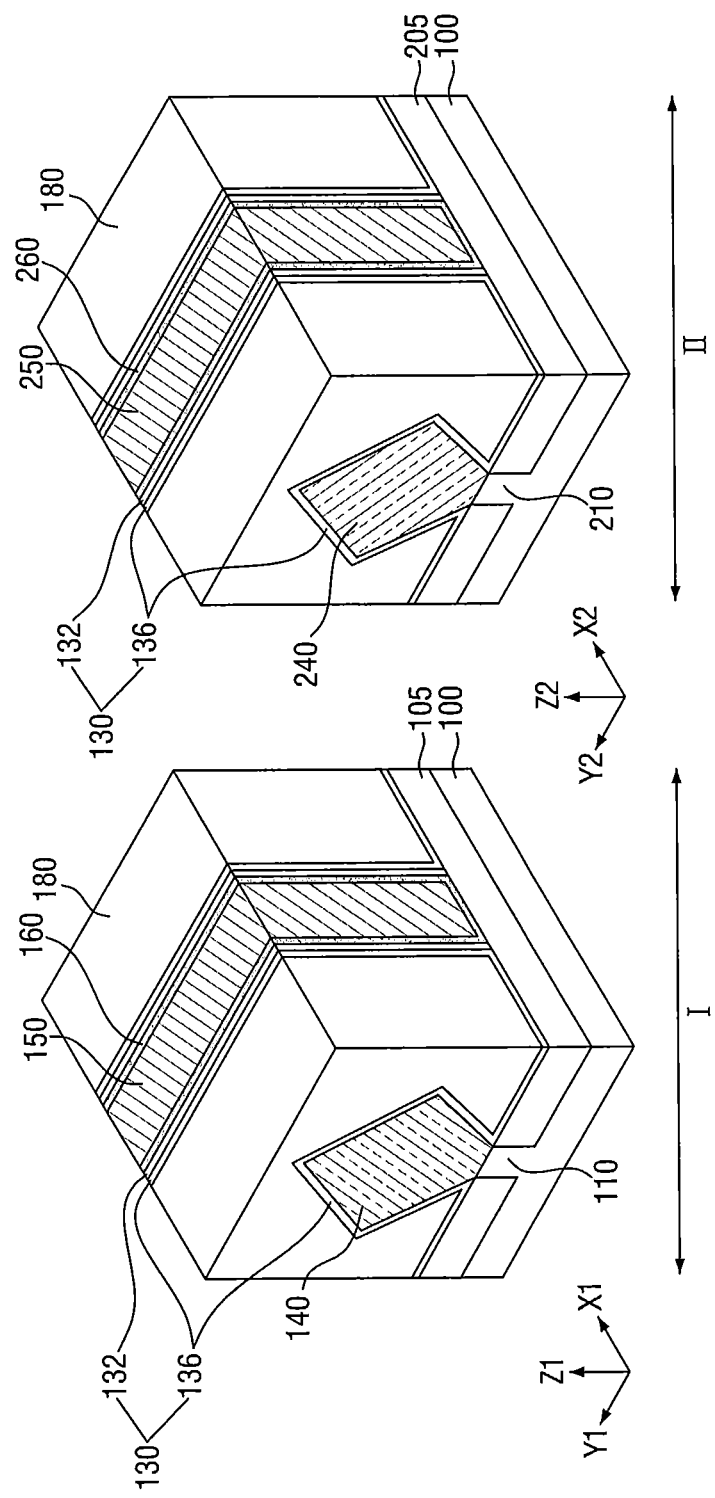

Referring to FIG. 30, a first gate dielectric film 160 and the first gate electrode 150 are formed on the first region I of the substrate 100, and a second gate dielectric film 260 and the second gate electrode 250 are formed on the second region II of the substrate 100.

For example, the first gate dielectric film 160 may be formed to extend along the profile of the first gate trench 530t, and the first gate electrode 150 may be formed on the first gate dielectric film 160 to fill the first gate trench 530t. Also, for example, the second gate dielectric film 260 may be formed to extend along the profile of the second gate trench 630t, and the second gate electrode 250 may be formed on the second gate dielectric film 260 to fill the second gate trench 630t.

In this manner, the semiconductor device of FIG. 11 can be obtained.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
a gate electrode extending in a first direction, on a substrate;
first outer spacers extending along side surfaces of the gate electrode;
a first active pattern extending in a second direction to penetrate the gate electrode and the first outer spacers, wherein the second direction intersects the first direction;
epitaxial patterns on the first active pattern and on side surfaces of the first outer spacers;
second outer spacers between the first outer spacers and the epitaxial patterns; and
inner spacers between the substrate and the first active pattern and between the gate electrode and the epitaxial patterns,
wherein, in a cross section that intersects the second direction, at least parts of the second outer spacers are on side surfaces of the first active pattern and side surfaces of the inner spacers, and
wherein top surfaces of the second outer spacers are lower than a top surface of the gate electrode.

2. The semiconductor device of claim 1, wherein a dielectric constant of the second outer spacers is greater than a dielectric constant of the first outer spacers.

3. The semiconductor device of claim 1, wherein a dielectric constant of the second outer spacers is greater than a dielectric constant of the inner spacers.

4. The semiconductor device of claim 1, further comprising third outer spacers extending along side surfaces of the first outer spacers,
wherein the second outer spacers are on first portions of the first outer spacers, and
wherein the third outer spacers are on second portions of the first outer spacers.

5. The semiconductor device of claim 4, wherein a dielectric constant of the second outer spacers is greater than a dielectric constant of the first outer spacers and a dielectric constant of the third outer spacers.

6. The semiconductor device of claim 1, wherein the top surfaces of the second outer spacers are substantially coplanar with top surfaces of the epitaxial patterns.

7. The semiconductor device of claim 1, wherein a thickness of the second outer spacers is smaller than a thickness of the inner spacers.

8. The semiconductor device of claim 1, further comprising a second active pattern spaced apart from the first active pattern and extending in the second direction to penetrate the gate electrode and the first outer spacers,
wherein the inner spacers are between the first and second active patterns.

9. The semiconductor device of claim 1, wherein the epitaxial patterns comprise n-type impurities.

10. A semiconductor device comprising:
a gate electrode extending in a first direction, on a substrate;
first outer spacers extending along side surfaces of the gate electrode;
an active pattern extending in a second direction to penetrate the gate electrode and the first outer spacers, wherein the second direction intersects the first direction;
epitaxial patterns on the active pattern and on side surfaces of the first outer spacers, the epitaxial patterns protruding away from the substrate beyond a top surface of the active pattern;
second outer spacers between the first outer spacers and the epitaxial patterns and on the top surface of the active pattern; and
third outer spacers extending along side surfaces of the first outer spacers, top surfaces of the second outer spacers, and top surfaces of the epitaxial patterns,
wherein a dielectric constant of the second outer spacers is greater than a dielectric constant of the first outer spacers and a dielectric constant of the third outer spacers, and
wherein the top surfaces of the second outer spacers are lower than a top surface of the gate electrode.

11. The semiconductor device of claim 10, further comprising inner spacers between the substrate and the active pattern and between the gate electrode and the epitaxial patterns.

12. The semiconductor device of claim 11, wherein the dielectric constant of the second outer spacers is greater than a dielectric constant of the inner spacers.

13. The semiconductor device of claim 10, wherein the top surfaces of the second outer spacers are concave.

14. The semiconductor device of claim 10, wherein a height of uppermost parts of the second outer spacers is smaller than a height of uppermost parts of the epitaxial patterns relative to the substrate.

15. The semiconductor device of claim 10, wherein the epitaxial patterns comprise n-type impurities.

16. The semiconductor device of claim 10, further comprising:
a gate dielectric film between the gate electrode and the first outer spacers and between the gate electrode and the active pattern.

17. A semiconductor device comprising:
a substrate including an n-type metal-oxide semiconductor (NMOS) region and a p-type metal-oxide semiconductor (PMOS) region;
a first gate electrode extending in a first direction on the NMOS region;
a first active pattern extending in a second direction to penetrate the first gate electrode, wherein the second direction intersects the first direction;
epitaxial patterns on the first active pattern and on side surfaces of the first gate electrode;
a second gate electrode extending in a third direction, on the PMOS region;
a second active pattern extending in a fourth direction to penetrate the second gate electrode, wherein the fourth direction intersects the third direction;
first outer spacers extending along side surfaces of the first gate electrode and side surfaces of the second gate electrode;
second outer spacers between the first outer spacers and the epitaxial patterns; and
third outer spacers extending along side surfaces of the first outer spacers, top surfaces of the second outer spacers, and top surfaces of the epitaxial patterns,
wherein a dielectric constant of the second outer spacers is greater than a dielectric constant of the first outer spacers and a dielectric constant of the third outer spacers, and
wherein the top surfaces of the second outer spacers are lower than a top surface of the first gate electrode.

18. The semiconductor device of claim 17, further comprising inner spacers between the substrate and the first active pattern and between the first gate electrode and the epitaxial patterns, wherein the dielectric constant of the second outer spacers is greater than a dielectric constant of the inner spacers.

19. The semiconductor device of claim 18, wherein the dielectric constant of the first outer spacers, the dielectric constant of the third outer spacers, and the dielectric constant of the inner spacers are 5 or less.

20. The semiconductor device of claim 18, wherein the first outer spacers, the third outer spacers, and the inner spacers comprise silicon oxynitride, silicon carbonitride, silicon carbide, silicon oxycarbide, silicon boron nitride, silicon boron carbonitride, and/or silicon oxycarbonitride, and wherein the second outer spacers comprise silicon nitride.

\* \* \* \* \*